(12) United States Patent
Nakamura

(10) Patent No.: US 6,678,302 B2
(45) Date of Patent: Jan. 13, 2004

(54) SEMICONDUCTOR DEVICE AND MANUFACTURING METHOD THEREOF

(75) Inventor: Koji Nakamura, Saitama (JP)

(73) Assignee: Oki Electric Industry Co., Ltd., Tokyo (JP)

(*) Notice: Subject to any disclaimer, the term of this patent is extended or adjusted under 35 U.S.C. 154(b) by 215 days.

(21) Appl. No.: 09/867,675

(22) Filed: May 31, 2001

(65) Prior Publication Data

US 2002/0018503 A1 Feb. 14, 2002

(30) Foreign Application Priority Data

Aug. 11, 2000 (JP) ........................................ 2000-244415

(51) Int. Cl.[7] .............................................. H01S 3/19
(52) U.S. Cl. .............................. 372/50; 372/48; 438/31
(58) Field of Search ........................ 372/50, 45; 385/14, 385/131; 438/39, 31

(56) References Cited

U.S. PATENT DOCUMENTS 5,657,339 A * 8/1997 Fukunaga ................ 372/50
5,987,046 A * 11/1999 Kobayashi et al. ........... 372/45
6,108,481 A * 8/2000 Tohyama et al. ............ 438/31
6,226,310 B1 * 5/2001 Takagi et al. ............. 372/50

OTHER PUBLICATIONS

H. Yamazaki, et al, "An investigation on simultaneously demonstrated low voltage and high power operation in DFB–LD/modulator integrated light source", The Institute of Electronics, Information and Communication Engineers; Technical Report of IEICE.LQE95–18 (Jun. 1995); pp. 13–18.

* cited by examiner

*Primary Examiner*—Albert W. Paladini
(74) *Attorney, Agent, or Firm*—Volentine Francos, PLLC

(57) ABSTRACT

A semiconductor device, which includes a first region having an optical waveguide layer and a second region having a light receiving layer receiving a light from the first region, that improves an intensity of the light from the light receiving layer, and a manufacturing method thereof. An active layer, a cladding layer and a contact layer in a selective growth region of a laser forming region are formed thicker than an absorptive layer, the cladding layer and the contact layer in a modulator forming region A ridge part in the laser forming region therefore has a height greater than that in the modulator forming region, Also in the ridge part, a width of contact surface of the cladding layer with the absorptive layer is greater than a width of contact surface of the cladding layer with the active layer.

21 Claims, 16 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Description of the Related Art

The following document discloses a technology relative to a conventional semiconductor laser with electro-absorption type modulator.

Document: H. Yamazaki, M. Yamaguchi, Y. Sakata, Y. Inomoto, K. Komatsu; Opto-Electronics Res.Labs., ULSI Dev.Labs., NEC Corp. "An investigation on simultaneously demonstrated low voltage and high power operation in DFB-LD/modulator integrated light sources" THE INSTITUTE OF ELECTRONICS, INFORMATION AND COMMUNICATION ENGINEERS; TECHNICAL REPORT OF IEICE. LQE95-18 (1995–06)

The semiconductor laser disclosed in the above document has features of having a window area in order to reduce an edge (end) reflectance. With reference to FIG. 28 to FIG. 31, a manufacture process of conventional semiconductor laser will be described below.

A grating 3 is formed in a laser forming region LR of a substrate (InP) 1, and thereafter, a mask pair 5 is formed with respect to the substrate 1. A mask width of each mask constituting the mask pair 5 differs in the laser forming region LR and a modulator forming region MR. The mask width in the laser forming region LR is wider than that in the modulator forming region MR. For example, the narrow mask width is adjusted to 5 $\mu$m; on the other hand, the wide mask width is adjusted to 50 $\mu$m. Moreover, an interval between masks constituting the mask pair 5 is adjusted to 1 to 3 $\mu$m.

A material InGaAsP is selectively grown using a metal organic vapor phase epiytaxy (MOVPE) method. As a result, an active layer (multiple quantum wells (MQW) structure) 7 is formed in the laser forming region LR; on the other hand, an absorptive layer 9 is formed in the modulator forming region MR. The material InP is grown with respect to these active layer 7 and absorptive layer 9 so that a cladding layer 11 is formed (see FIG. 28).

Thereafter, the mask pair 5 is removed so that a mask (SiO$_2$) 13 is formed. Then, using the mask 13 thus formed, part of the cladding layer 11 and the absorptive layer 9 is etched so that a window region WR is formed (see FIG. 29).

Then, a mask pair 15 is formed, and InP is further grown on the cladding layer 11 so that a cladding layer 17 including the cladding layer 11 is formed. A contact layer 19 is formed on the cladding layer 17 thus formed (see FIG. 30).

After the mask pair 15 is removed, a metal material is evaporated on the surface of the contact layer 19 so as to form a predetermined pattern. Moreover, a metal material is vapor-deposited onto the back side of the substrate 1. After the evaporation, annealing treatment is subject to these materials so that the vapor-deposited metal is alloyed. By doing so, a laser p-side electrode 21 is formed in the laser forming region LR; on the other hand, a modulator p-side electrode 23 is formed in the modulator forming region MR, and further, an n-side electrode 25 is formed onto the back side of the substrate 1. In this case, the contact layer 19 between the laser p-side electrode 21 and the modulator p-side electrode 23 is removed before evaporating the metal material.

The end portion of semiconductor device is cloven and made into a chip, and thereafter, an end face of the modulator forming region MR is coated with a low reflection film 27. In a chipped semiconductor laser with modulator, an optical axis length of the laser forming region LR is set to a range from 300 to 7001 $\mu$m, and an optical axis length of the modulator forming region MR is set to a range from 50 to 250 $\mu$m, and further, an optical axis length of the window region WR is set to a range from 10 to 50 $\mu$m (see FIG. 31).

In the semiconductor laser with modulator, when a modulation voltage is applied to a modulator during laser oscillation, the modulator is operated so as to absorb a laser beam. In this case, when a light absorption exceeds a predetermined value, an element breakdown occurs in an interface between the modulator and laser. However, the conventional semiconductor laser with modulator has no structure effective for preventing the element breakdown phenomenon as described above. For this reason, in the conventional semiconductor laser with modulator, in the case where a laser output is slightly enhanced, the light absorption of modulator exceeds a limit value; as a result, a problem has arisen such that an element breakdown occurs.

SUMMARY OF THE INVENTION

The present invention has been made in view of the above problem in the prior art. It is, therefore, an object of the present invention to provide a semiconductor device, which includes a first region having an optical waveguide layer, and a second region having a light receiving layer receiving a light from the first region, and can improve a light intensity of the light receiving layer, and to provide a manufacturing method thereof.

In order to solve the above problem and to achieve the above object, according to a first aspect, the present invention provides a semiconductor device, which includes a first region having an optical waveguide, and a second region having a light receiving layer receiving a light from the first region. The semiconductor device includes an optical confinement layer, which is formed on the optical waveguide layer and the light receiving layer and has a shape extending to an optical axis direction. Further, a width of contact surface of the optical confinement layer with the light receiving layer is wider than a width of contact surface of the optical confinement layer with the optical waveguide layer.

With the above construction of the present invention, when the light receiving layer receives a light propagated through the optical waveguide layer, it is possible to prevent an element breakdown, which is likely to occur in a junction interface between the optical waveguide layer and the light receiving layer.

According to a second aspect, the present invention provides the semiconductor device, which further includes a coupling part for reducing a density of light propagated through the optical waveguide layer, between the first and second regions. Preferably, the coupling part has a direction propagating a light propagated through the optical waveguide layer other than the optical axis direction of the optical waveguide layer and the light receiving layer.

With the above construction of the present invention, even if an intensity of light propagated through the optical waveguide layer is high, it is possible to moderate a damage given to the light receiving layer when receiving a light.

According to a third aspect, the present invention provides a manufacturing method of a semiconductor device including a first region having an optical waveguide layer, and a second region having a light receiving layer receiving a light from the first region. The manufacturing method comprises the following steps of: forming the optical waveguide layer and the light receiving layer; growing the optical confinement layer on the optical waveguide layer and the light receiving layer so that the optical confinement layer in a selective region selected from the first region is formed thicker than the optical confinement layer in other regions; and etching the optical confinement layer so that the optical confinement layer is formed into a shape of ridge extending to an optical axis direction, and a shape of inverse mesa having a width formed so as to gradually becomes narrow in its depth direction.

With the above manufacturing method of the present invention, in the contact surface of the optical confinement layer formed into an inverse-mesa ridge shape by etching with the optical waveguide layer and the light receiving layer, the following relation is formed. More specifically, a width of contact surface of the optical confinement layer with the light receiving layer is wider than a width of contact surface of the optical confinement layer with the optical waveguide layer. Therefore, in the semiconductor device manufactured by the above manufacturing method, when the light receiving layer receives a light propagated through the optical waveguide layer, it is possible to prevent an element breakdown, which is likely to occur in a junction interface between the optical waveguide layer and the light receiving layer.

Preferably, the selective region is a region held between a mask pair formed in the first region. Further, the optical confinement layer is selectively grown with respect to other regions in the region held between the mask pair. Therefore, according to the manufacturing method, the optical confinement layer in the selective region is formed thicker than the optical confinement layer in other regions.

According to a fourth aspect, the present invention provides a manufacturing method of a semiconductor device including a first region having an optical waveguide layer, and a second region having a light receiving layer receiving a light from the first region. The manufacturing method comprises the following steps of: forming the optical waveguide layer and the light receiving layer; forming the optical confinement layer on the optical waveguide layer and the light receiving layer; and etching the optical confinement layer using a mask, which extends from the first region to the second region and has a mask width in the second region wider than a mask width in the first region.

With the above manufacturing method of the present invention, a width of contact surface of the etched optical confinement layer with the light receiving layer is wider than a width of contact surface of the optical confinement layer with the optical waveguide layer. Therefore, in the semiconductor device manufactured by the above manufacturing method, when the light receiving layer receives a light propagated through the optical waveguide layer, it is possible to prevent an element breakdown, which is likely to occur in a junction interface between the optical waveguide layer and the light receiving layer.

For example, the present invention is applicable to a semiconductor laser with modulator used as semiconductor device. In this case, the first region is equivalent to a region where a laser device is formed, and the second region is equivalent to a region where a modulator for modulating a laser beam outputted by the laser device is formed. Further, the optical waveguide layer is equivalent to an active layer, the light receiving layer is equivalent to an absorptive layer, and the optical confinement layer is equivalent to a cladding layer.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1:
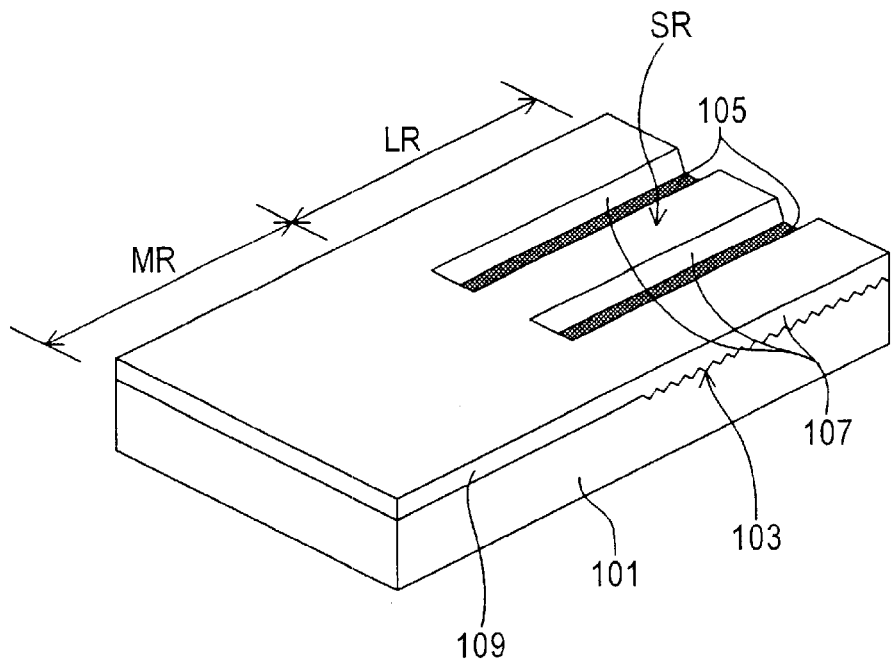
FIG. 1 is a perspective view showing a manufacture process (first step) of a semiconductor laser with modulator according to a first embodiment of the present invention.
Figure 2:
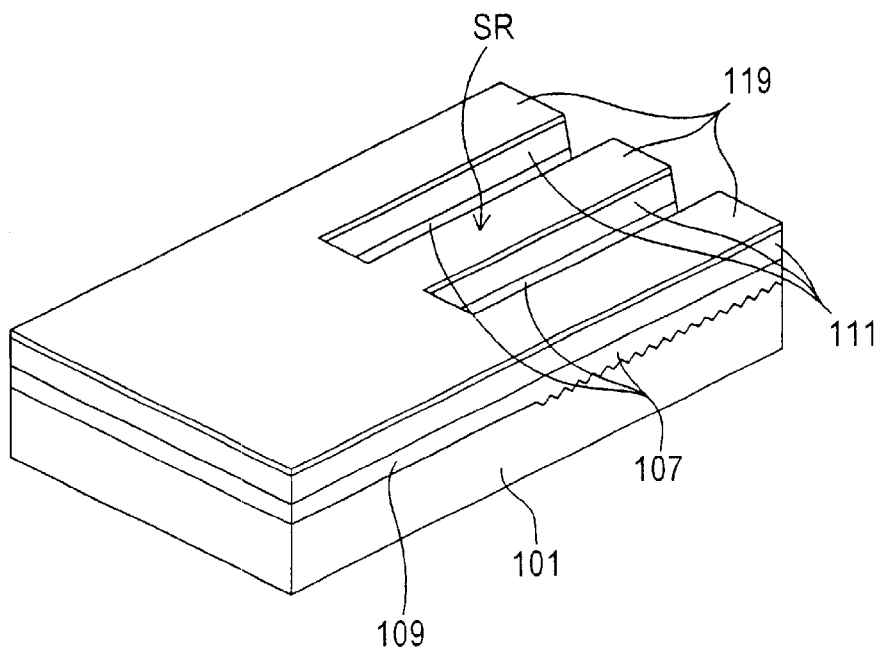
FIG. 2 is a perspective view showing a manufacture process (second step) of the semiconductor laser with modulator according to the first embodiment of the present invention.
Figure 3A:
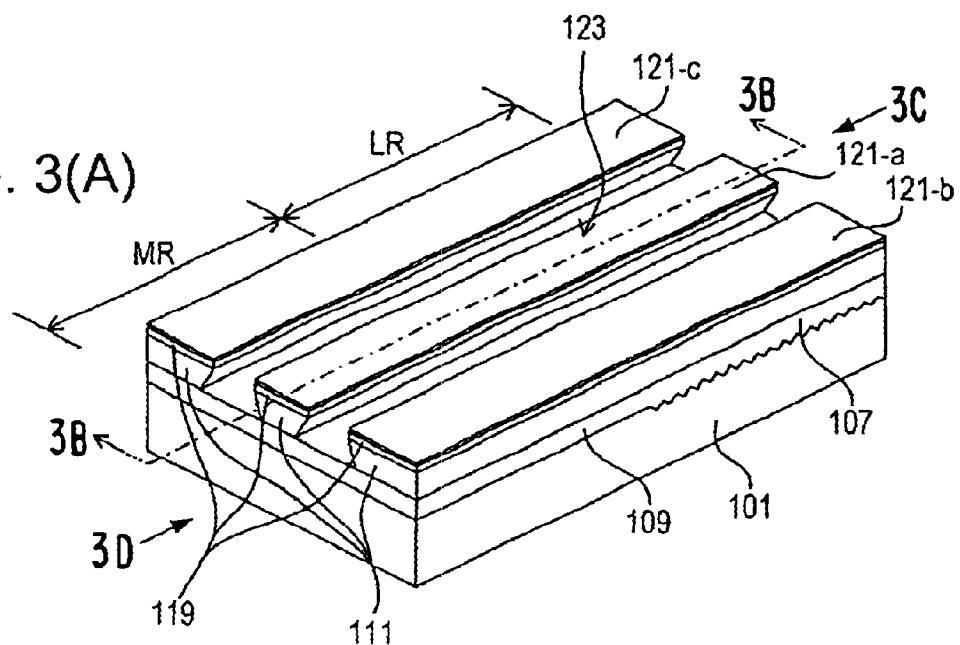
FIG. 3 is a perspective view showing a manufacture process (third step) of the semiconductor laser with modulator according to the first embodiment of the present invention.
Figure 3B:
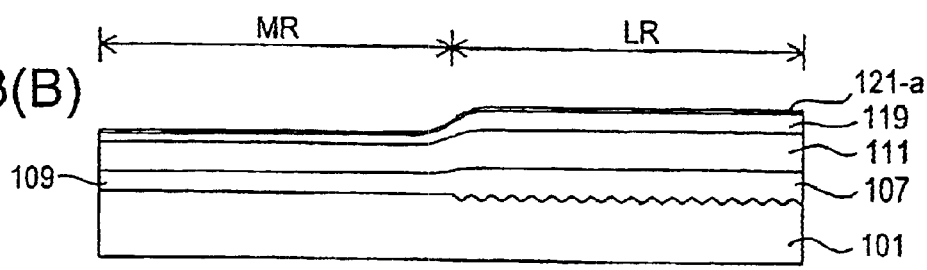
Figure 3C:
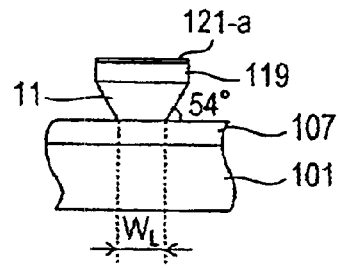
Figure 3D:
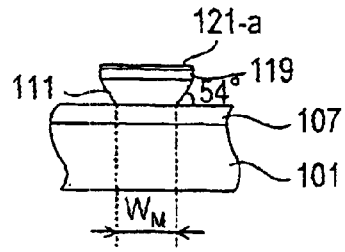
Figure 4:
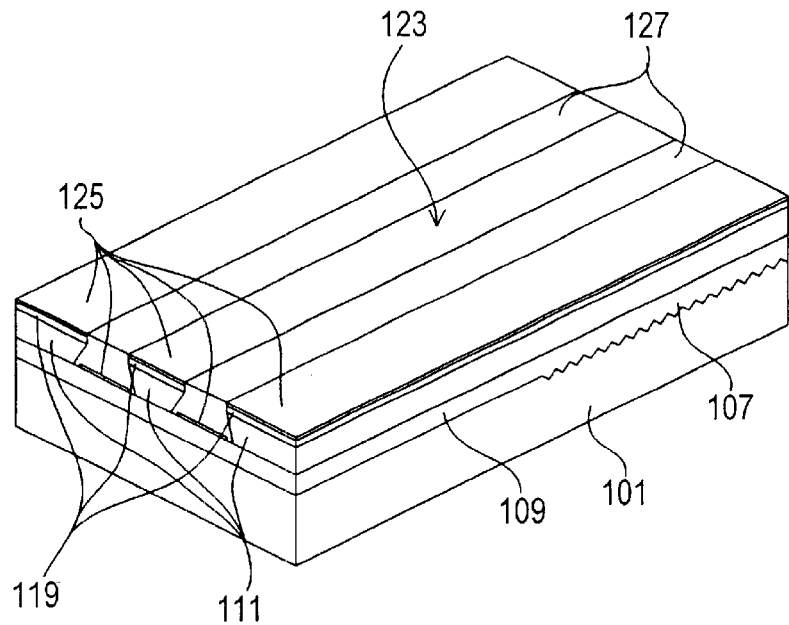
FIG. 4 is a perspective view showing a manufacture process (fourth step) of the semiconductor laser with modulator according to the first embodiment of the present invention.
Figure 5:
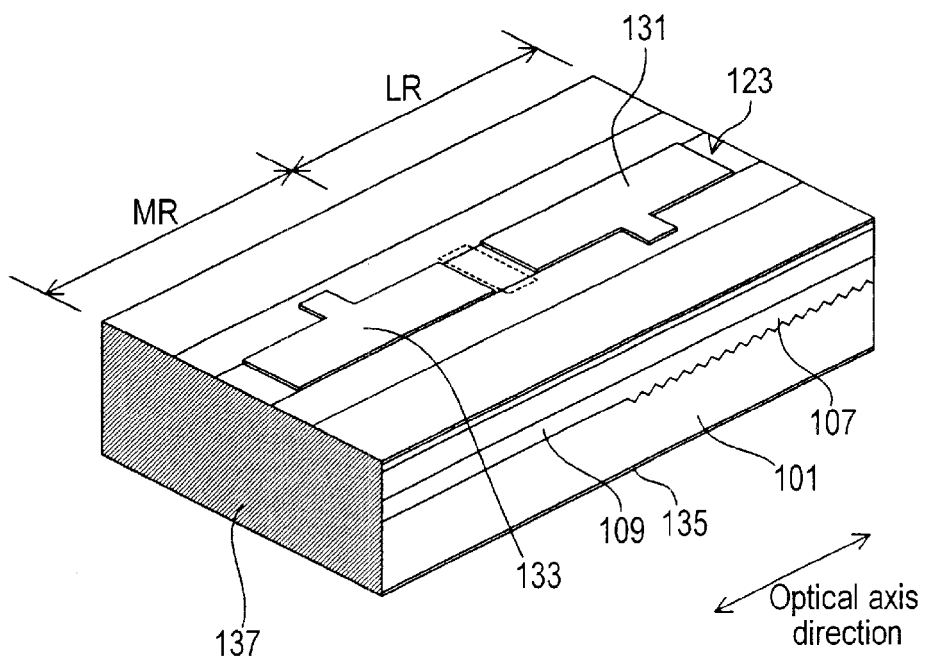
FIG. 5 is a perspective view showing a manufacture process (fifth step) of the semiconductor laser with modulator according to the first embodiment of the present invention.
Figure 6:
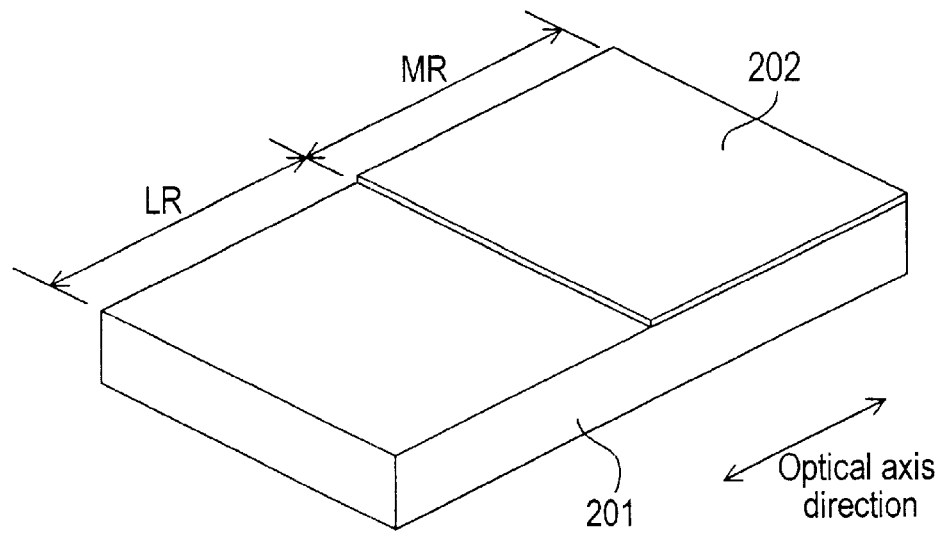
FIG. 6 is a perspective view showing a manufacture process (first step) of a semiconductor laser with modulator according to a second embodiment of the present invention.

Preferred embodiments of a semiconductor device and a manufacturing method thereof according to the present invention will be detailedly described below with reference to the accompanying drawings. In the following description and the accompanying drawings, like reference numerals are given to designate the constituent elements having the substantially same function and structure, and thereby, the repeated explanation will be omitted.

First Embodiment

A structure of semiconductor laser with modulator used as a semiconductor device according to a first embodiment of the present invention and a manufacturing method thereof will be described below with reference to FIG. 1 to FIG. 5.

A grating 103 is formed in a laser forming region LR of a substrate (InP) 101, and thereafter, a selective growth mask pair 105 is formed with respect to a laser forming region LR of the substrate 101. A mask width of each mask constituting the selective growth mask pair 105 is set to a range from 5 to 100 $\mu$m, and an interval between the mask pair is set to a range from 1 to 40 $\mu$m.

A material, InGaAsP is selectively grown using a metal organic vapor phase epiytaxy (MOVPE) method. As a result, an active layer (multiple quantum wells (MQW) structure) 107 is formed in the laser forming region LR; on the other hand, an absorptive layer 109 is formed in a modulator forming region MR. In this case, in a region held between each mask constituting the selective growth mask pair 105, that is, a selective growth region SR, the material InGaAsP grows thicker than other regions (see FIG. 1). Then, a band gap of the active layer 107 formed in the selective growth region SR is wider than a band gap of the absorptive layer 109. Moreover, a wavelength of laser beam generated in the active layer 107 is shifted to a longer wavelength side as compared with the case where no selective growth mask pair 105 is used.

The material InP is grown with respect to the active layer 107 and the absorptive layer 109 so that a cladding layer 111 is formed. Further, a contact layer 119 is formed on the surface of the cladding layer 111. In this case, like the active layer 107, in the selective growth region SR, the cladding layer 111 and the contact layer 119 are formed thicker than other regions (see FIG. 2).

After the selective growth mask pair 105 is removed, a ridge part forming mask 121-*a* and side masks 121-*b* and 121-*c* are formed on the surface of the contact layer 119. The ridge part forming mask 121-*a* is formed from the selective growth region SR of the laser forming region LR to the modulator forming region MR, and has a width of 3 to 6 $\mu$m.

The contact layer 119 and the cladding layer 111, which are not coated with the ridge part forming mask 121-*a* and side masks 121-*b* and 121-*c* are etched and removed in succession so that part of each surface of the active layer 107 and the absorptive layer 109 is exposed. As a result, an inverse mesa-shaped ridge part 123 is formed (see FIG. 3).

The shape of the ridge part 123 will be described below with reference to FIG. 3. As described above, the active layer 107, the cladding layer 111 and the contact layer 119 in the selective growth region SR of the laser forming region LR are formed thicker than the absorptive layer 109, the cladding layer 111 and the contact layer 119 in the modulator forming region MR. Therefore, as seen from a sectional view cut along by the line A–A' of FIG. 3, the ridge part 123 formed in the laser forming region LR is higher than that formed in the modulator forming region MR.

Now, it has attracted attention to a width $W_C$ of the bottom surface of the cladding layer 111 in the ridge part 123. The ridge part forming mask 121-*a* used for forming the ridge part 123 has a predetermined (fixed) mask width $W_M$ over the entire length from the laser forming region LR to the modulator forming region MR. In an etching process for forming the ridge part 123, when a face (111) of the cladding layer 111 is exposed, the face (i.e., side wall of the cladding layer 111) has an angle of 54° with respect to the surface of the active layer 107 and the absorptive layer 109. Therefore, when a thickness of the cladding layer 111 is set as "ad", the width $W_C$ of the bottom surface of the cladding layer 111 in the ridge part 123 is obtained from the following equation (1-1).

$$W_C = W_M - 2d/\tan 54° \quad (1\text{-}1)$$

As is evident from the above equation (1-1), in the ridge part 123, the width $W_C$ of the bottom surface of the cladding layer 111 takes different value in accordance with a height "d" of the cladding layer 111. As described before, the height "d" of the cladding layer 111 differs in the laser forming region LR and the modulator forming region MR. When each height of these regions LR and MR is expressed as $d_L$ and $d_M$, the following equation (1-2) is formed.

$$d_L > d_M \quad (1\text{-}2)$$

Moreover, in the ridge part 123, when a width of the laser forming region LR at the bottom surface of the cladding layer 111 is expressed as $W_{CL}$, and a width of the modulator forming region MR is expressed as $W_{CM}$, the following relation (1-3) is obtained from the above equations (1-1) and (1-2).

$$W_{CL} < W_{CM} \quad (1\text{-}3)$$

By the way, in the ridge part 123, the bottom surface of the cladding layer 111 contacts with the active layer 107 and the absorptive layer 109. Therefore, when viewing the ridge part 123 from arrows directions B and C shown in FIG. 3, it can be seen that a width $W_M$ of the contact surface of the cladding layer 111 with the absorptive layer 109 is wider than a width $W_L$ of the contact surface of the cladding layer 111 with the active layer 107.

Next, the ridge part forming mask 121-a and the side masks 121-b and 121-c are removed so that an insulation (dielectric) film ($SiO_2$) 125 is formed. Then, a material, polyimide 127 is buried in each groove at both sides of the ridge part 123 (see FIG. 4).

A metal material is vapor-deposited on the upper surface of the ridge part 123 so that a predetermined pattern is formed. Moreover, a metal material is vapor-deposited onto the back side of the substrate 101. After the vapor deposition, an annealing treatment is subjected so that the vapor-deposited metal is alloyed. By doing so, a laser p-side electrode 131 is formed in the laser forming region LR, and a modulator p-side electrode 133 is formed in the modulator forming region MR, and further, an n-side electrode 135 is formed onto the back side of the substrate 101. In this case, the contact layer 119 between the laser p-side electrode 131 and the modulator p-side electrode 133 is removed before the metal material is vapor-deposited so that an electrode isolating region (portion shown by a dotted line in FIG. 5, optical axis length: 20 to 100 μm) is secured.

The end portion of semiconductor device is cloven and made into a chip, and thereafter, an end face of the modulator forming region MR is coated with a low reflection film 137. In a chipped semiconductor laser with modulator, an optical axis length of the laser forming region LR is set to a range from 300 to 700 μm, and an optical axis length of the modulator forming region MR is set to a range from 50 to 250 μm (see FIG. 5).

The following is a description on an operation of the aforesaid semiconductor laser with modulator according to the first embodiment.

A forward voltage is applied to the laser p-side electrode 131 and the n-side electrode 135 so that a forward current is injected into the active layer 107. By the forward current thus injected, a laser oscillation is generated. In general, in the case where the forward current ranges 50 to 100 mA, a laser output (power) of 2 to 5 mW can be obtained.

On the other hand, a reverse voltage (0.5 to −4V) is applied to the modulator p-side electrode 133 and the n-side electrode 135, and thereby, a modulation signal (signal beam) is generated from laser beam. More specifically, in the case where a modulation voltage (reverse voltage) ranges from 0.5 to −0.5V, an optical power is obtained from the semiconductor laser with modulator; on the contrary, in the case where the modulation voltage ranges from −2.5 to −4V, the optical power is shielded. In the manner as described above, an intensity modulation of optical power is made, and thus, a signal beam is generated.

As described above, according to this first embodiment, the semiconductor laser with modulator is constructed in a manner that in the ridge part 123, the width of the contact surface of the cladding layer 111 with the absorptive layer 109 is wider than that of the contact surface of the cladding layer 111 with the active layer 107. Therefore, an absorption efficiency of laser beam is improved in the modulator forming region MR, and further, extinction characteristics and radiant efficiency are improved. As a result, it is possible to improve a power of laser beam in the laser forming region LR while preventing element breakdown.

Moreover, according to the manufacturing method of the semiconductor laser with modulator of the first embodiment, a crystal growth by selective growth method is carried out only one time, and thereby, it is possible to control a thickness of the cladding layer 111. In other words, there is no need of adding a special manufacture process for preventing an element breakdown in the modulator forming region MR. Therefore, this contributes to improvement in the yield of product.

Second Embodiment

A structure of semiconductor laser with modulator used as a semiconductor device according to a second embodiment of the present invention and a manufacturing method thereof will be described below with reference to FIG. 6 to FIG. 13.

A mask 202 is formed in a modulator forming region MR of a substrate (InP) 201. The mask 202 has a length (optical axis direction) of 50 to 250 μm (see FIG. 6).

Figure 7:
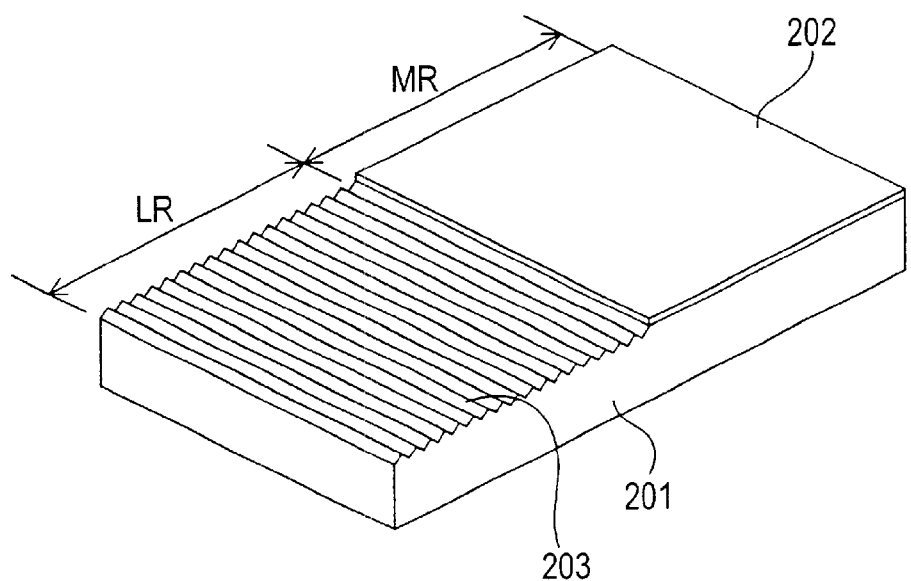
FIG. 7 is a perspective view showing a manufacture process (second step) of the semiconductor laser with modulator according to the second embodiment of the present invention.

A grating 203 is formed on the surface of the substrate 201, which is not coated with the mask 202 (see FIG. 7). The grating 203 is formed in a manner of using a resist film exposed by an interference exposure method as a mask, and etching the surface of the substrate 201. In the case of forming the grating 203 using electron beam lithography, no mask 202 is required. A region where the grating 203 is formed is a laser forming region LR.

After the mask 202 is removed, the material InGaAsP is grown on the surface of substrate 201 using a metal organic vapor phase epiytaxy (MOVPE) method. As a result, an active layer (multiple quantum wells (MQW) structure) 207 is formed in the laser forming region LR. In this case, the material InGaAsP directly grows with respect to the grating 203; for this reason, the device must be carefully preserved so that the shape of grating 203 does not collapse. For example, while a temperature rises up to growth temperature, no source gas flows into a chamber by a temperature of about 540° C., and only hydrogen is used as the atmospheric gas. After 540° C., a trace amount of arsine gas and phosphine gas flows into the chamber, and then, the device is preserved until the temperature reaches the growth temperature. When the temperature reaches the growth temperature, the material InGaAsP starts to grow.

Figure 8:
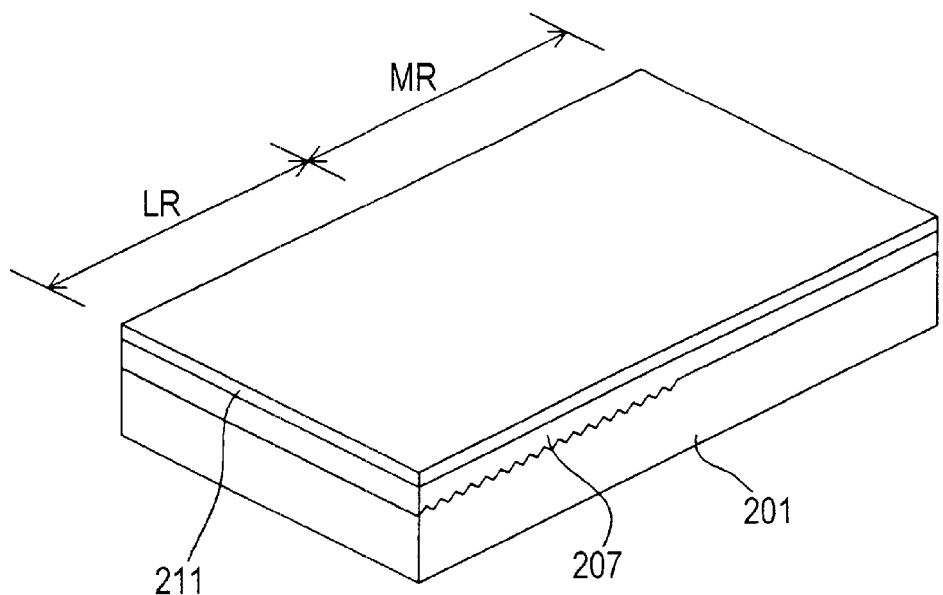
FIG. 8 is a perspective view showing a manufacture process (third step) of the semiconductor laser with modulator according to the second embodiment of the present invention.
Figure 9:
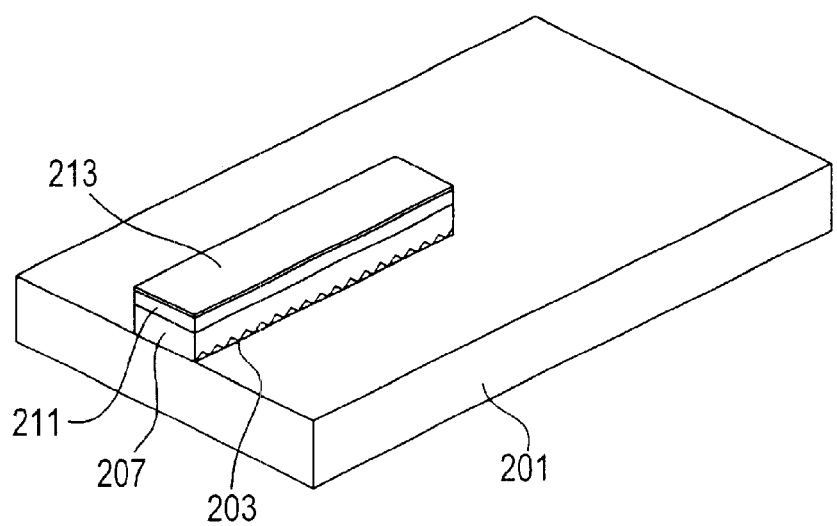
FIG. 9 is a perspective view showing a manufacture process (fourth step) of the semiconductor laser with modulator according to the second embodiment of the present invention.
Figure 10:
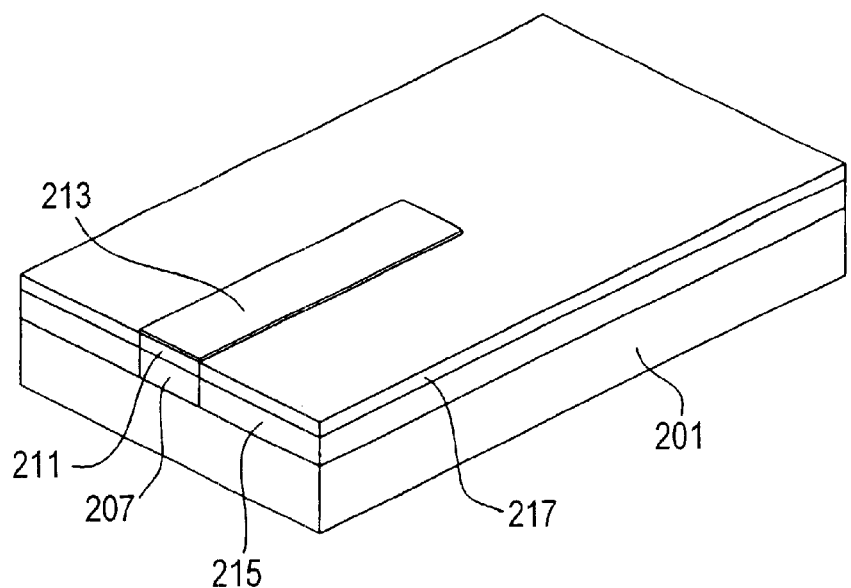
FIG. 10 is a perspective view showing a manufacture process (fifth step) of the semiconductor laser with modulator according to the second embodiment of the present invention.
Figure 11:
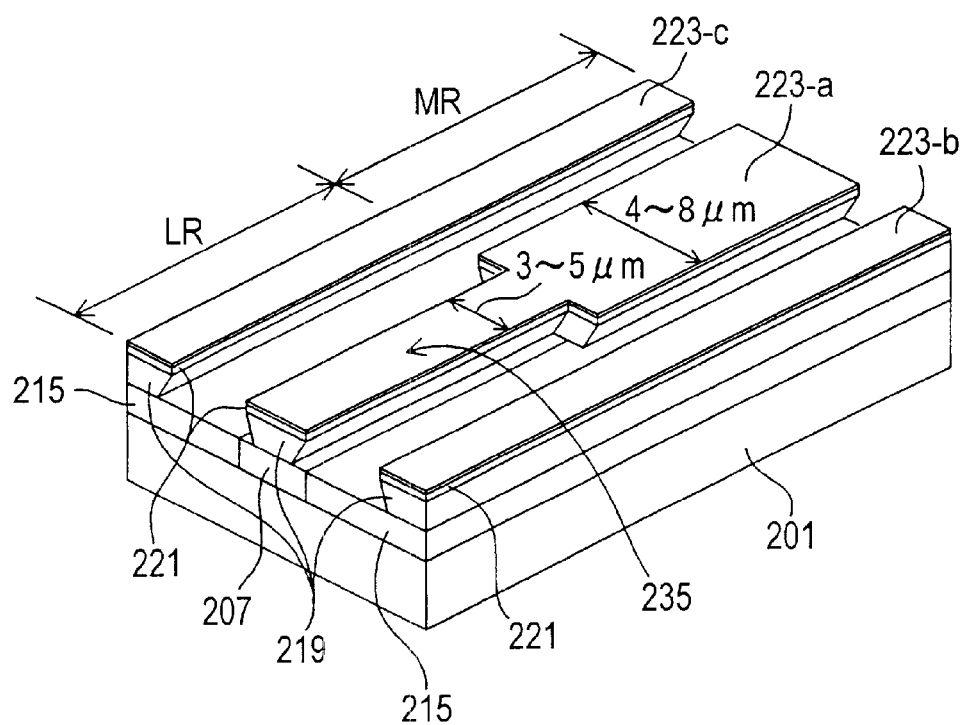
FIG. 11 is a perspective view showing a manufacture process (sixth step) of the semiconductor laser with modulator according to the second embodiment of the present invention.
Figure 12:
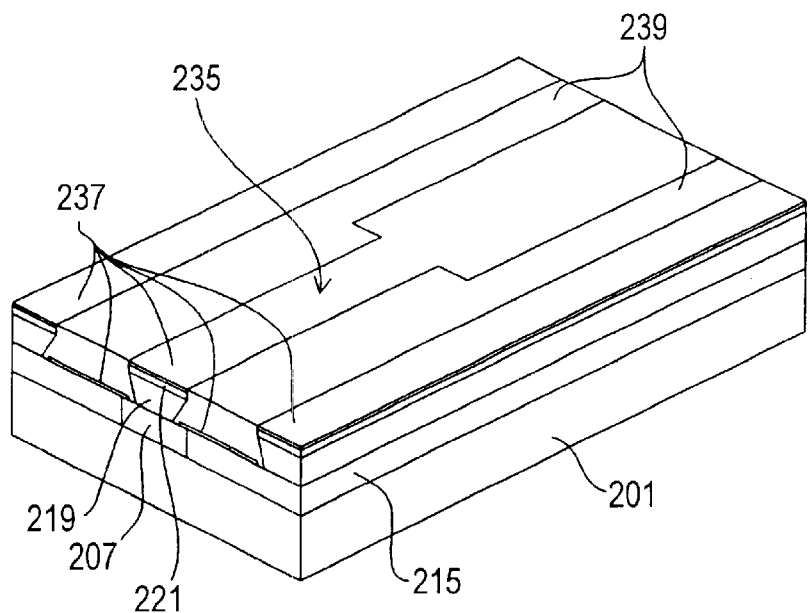
FIG. 12 is a perspective view showing a manufacture process (seventh step) of the semiconductor laser with modulator according to the second embodiment of the present invention.
Figure 13:
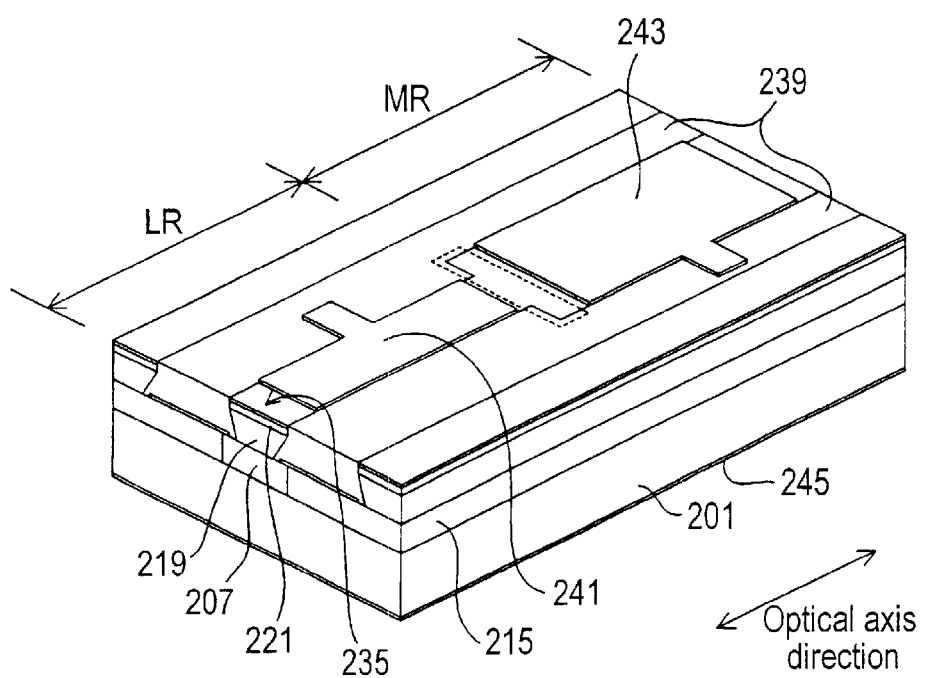
FIG. 13 is a perspective view showing a manufacture process (eighth step) of the semiconductor laser with modulator according to the second embodiment of the present invention.
Figure 14:
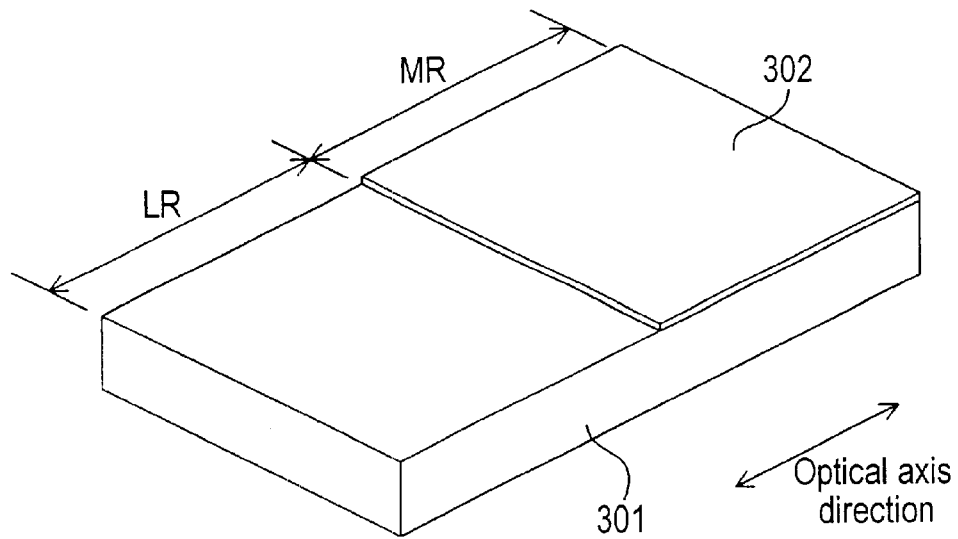
FIG. 14 is a perspective view showing a manufacture process (first step) of a semiconductor laser with modulator according to a third embodiment of the present invention.

The material InP is grown with respect to the active layer 207 so that a cladding layer 211 is formed (see FIG. 8).

A mask 213 is formed on the surface of the cladding layer 211 in order to etch like an island. Then, the cladding layer 211 and the active layer 207 formed in the laser forming region LR, which are not coated with the mask 213, and both layers formed in the modulator forming region MR are removed by etching in succession, and thus, the surface of the substrate 201 is exposed. In this case, of the grating 203 formed on the substrate 201, the range (i.e., grating 203), which is not coated with the mask 213, is removed by etching (see FIG. 9).

In the above range, which is not coated with the mask 213, the material InGaAsP is grown using a metal organic vapor phase epiytaxy (MOVPE) method so that an absorptive layer 215 is formed. Further, the material InP is grown on the absorptive layer 215 so that a cladding layer 217 is formed (see FIG. 10).

Thereafter, the mask 213 is removed, and then, the material P-InP is grown on the cladding layers 211 and 217 so that a cladding layer 219 including these cladding layers 211 and 217. Further, the material P-InGaAs is grown on the cladding layer 219 thus formed so that a contact layer 221 is formed.

A ridge part forming mask 223-*a* and side masks 223-*b* and 223-*c* are formed on the surface of the contact layer 221. A width of the ridge part forming mask 223-*a* differs in the laser forming region LR and the modulator forming region MR. The mask width in the modulator forming region MR is wider than the mask width in the laser forming region LR. For example, the narrower mask width is adjusted to a range from 3 to 5 μm; on the other hand, the wider mask width is adjusted to 4 to 8 μm.

The contact layer 221 and the cladding layer 219, which are not coated with the ridge part forming mask 223-*a* and the side masks 223-*b* and 223-*c*, are removed by etching in succession, and thus, part of the surface of active layer 207 and absorptive layer 215 is exposed. As a result, an inverse mesa-shaped ridge part 235 is formed (see FIG. 11).

The ridge part forming mask 223-*a* and the side masks 223-*b* and 223-*c* are removed, and thereafter, an insulation (dielectric) layer (SiO$_2$) 237 is formed. Then, the material polyimide 239 is buried in grooves formed at both sides of the ridge part 235 (see FIG. 12).

A metal material is vapor-deposited on the upper surface of the ridge part 235 so that a predetermined pattern is formed. Moreover, a metal material is vapor-deposited onto the back side of the substrate 201. After the vapor deposition, an annealing treatment is subjected to the device so that the vapor-deposited metal is alloyed. By doing so, a laser p-side electrode 241 is formed in the laser forming region LR, and a modulator p-side electrode 243 is formed in the modulator forming region MR, and further, an n-side electrode 245 is formed onto the back side of the substrate 201. In this case, the contact layer 221 between the laser p-side electrode 241 and the modulator p-side electrode 243 is removed before the metal material is vapor-deposited so that an electrode isolating region (portion shown by a dotted line in FIG. 13, optical axis length: 20 to 100 μm) is secured.

The end portion of semiconductor device is cloven and made into a chip, and thereafter, an end face of the modulator forming region MR is coated with a low reflection film (not shown). In a chipped semiconductor laser with modulator, an optical axis length of the laser forming region LR is set to a range from 300 to 700 μm, and an optical axis length of the modulator forming region MR is set to a range from 50 to 250 μm (see FIG. 13).

The following is a description on an operation of the aforesaid semiconductor laser with modulator according to the second embodiment.

A forward voltage is applied to the laser p-side electrode 241 and the n-side electrode 245 so that a forward current is injected into the active layer 207. By the forward current, a laser oscillation occurs. In general, in the case where the forward current ranges from 50 to 100 mA, a laser power of 2 to 5 mW can be obtained.

On the other hand, a reverse voltage (0.5 to −4V) is applied to the modulator p-side electrode 243 and the n-side electrode 245, and thereby, a modulation signal (signal beam) is generated from laser beam. More specifically, in the case where a modulation voltage (reverse voltage) ranges from 0.5 to −0.5V, an optical power is obtained from the semiconductor laser with modulator; on the contrary, in the case where the modulation voltage ranges from −2.5 to −4V, the optical power is shielded. In the manner as described above, an intensity modulation of optical power is made, and thus, a signal beam is generated.

As described above, according to the manufacturing method of the semiconductor laser with modulator of this second embodiment, in the case of forming the ridge part 235, the ridge part forming mask 223-*a* having two-stage width is used. Thus, in the ridge part 235, the width of the contact surface of the cladding layer 219 with the absorptive layer 215 is wider than that of the contact surface of the cladding layer 219 with the active layer 207. Therefore, an absorption efficiency of laser beam is improved in the modulator forming region MR, and further, a radiant efficiency are improved.

Moreover, according to the manufacturing method of the semiconductor laser with modulator of this second embodiment, the laser forming region LR and the modulator forming region MR are formed independently from each other, and thereafter, are directly coupled with each other. Therefore, a degree of freedom is improved in a device design.

Third Embodiment

A structure of semiconductor laser with modulator used as a semiconductor device according to a third embodiment of the present invention and a manufacturing method thereof will be described below with reference to FIG. 14 to FIG. 22.

A mask 302 is formed in a modulator forming region MR of a substrate (InP) 301. The mask 302 has a length (optical axis direction) of 50 to 250 μm (see FIG. 14).

Figure 15:
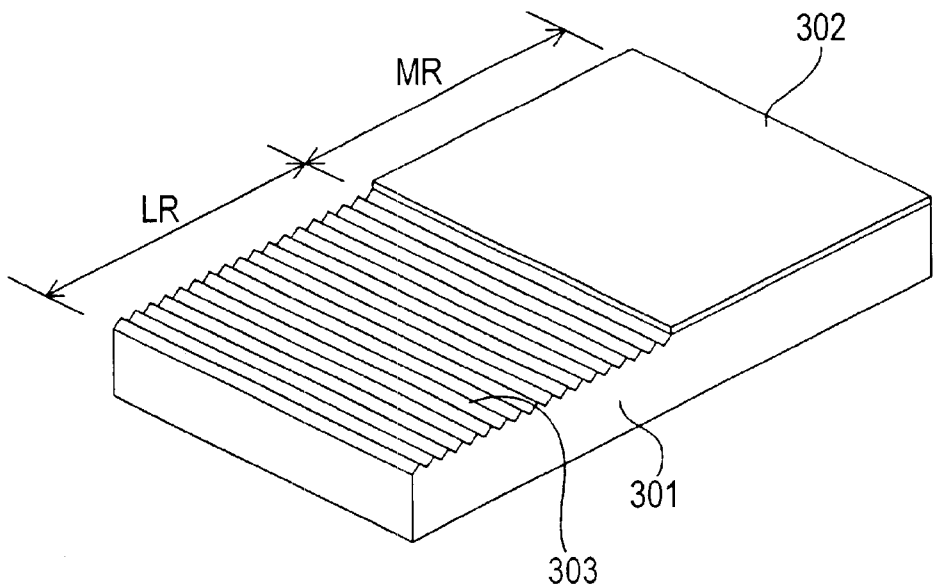
FIG. 15 is a perspective view showing a manufacture process (second step) of the semiconductor laser with modulator according to the third embodiment of the present invention.

A grating 303 is formed on the surface of the substrate 301, which is not coated with the mask 302 (see FIG. 15). The grating 303 is formed in a manner of using a resist film exposed by an interference exposure method as a mask, and etching the surface of the substrate 301. In the case of forming the grating 303 using electron beam lithography, no mask 302 is required. A region where the grating 303 is formed is a laser forming region LR.

After the mask 302 is removed, the material InGaAsP is grown on the surface of substrate 301 using a metal organic vapor phase epiytaxy (MOVPE) method. As a result, an active layer (multiple quantum wells (MQW) structure) 307 is formed in the laser forming region LR. In this case, the material InGaAsP directly grows with respect to the grating 303; for this reason, the device must be carefully preserved so that the shape of grating 303 does not collapse. For example, while a temperature rises up to growth temperature, no source gas flows into a chamber by a temperature of about 540° C., and only hydrogen is used as the atmospheric gas. After 540° C., a trace amount of arsine gas and phosphine gas flows into the chamber, and then, the device is preserved until the temperature reaches the growth temperature. When the temperature reaches the growth temperature, the material InGaAsP starts to grow.

Figure 16:
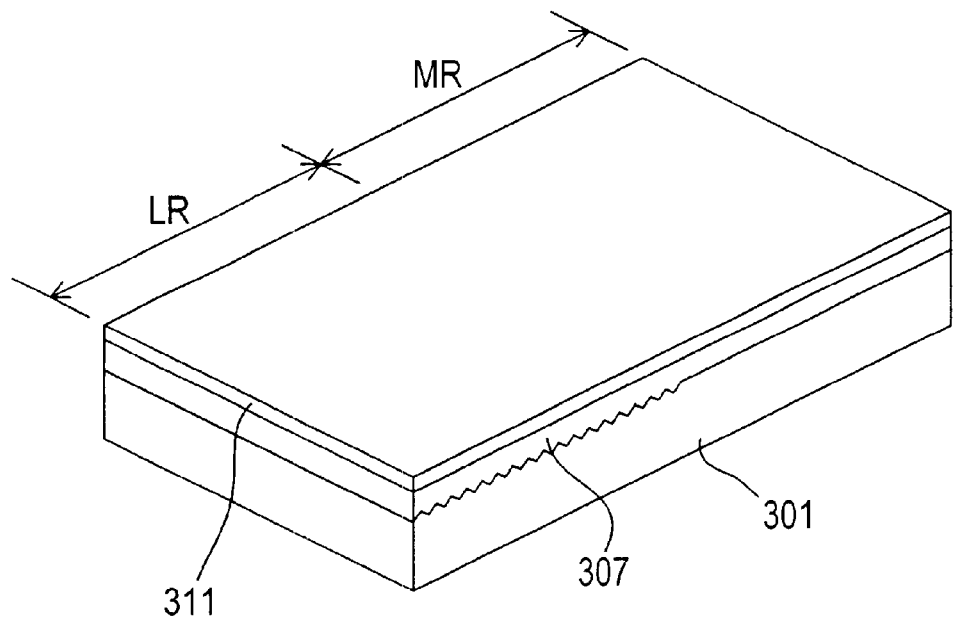
FIG. 16 is a perspective view showing a manufacture process (third step) of the semiconductor laser with modulator according to the third embodiment of the present invention.
Figure 17:
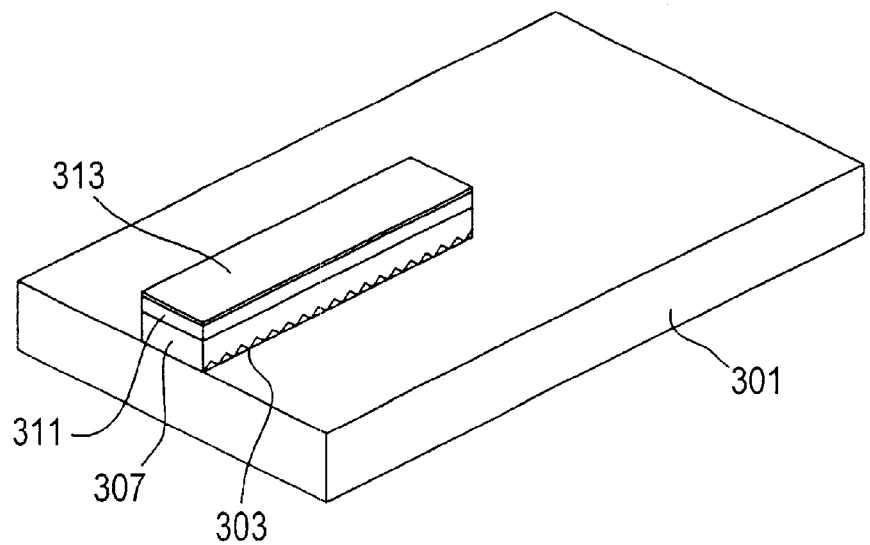
FIG. 17 is a perspective view showing a manufacture process (fourth step) of the semiconductor laser with modulator according to the third embodiment of the present invention.
Figure 18:
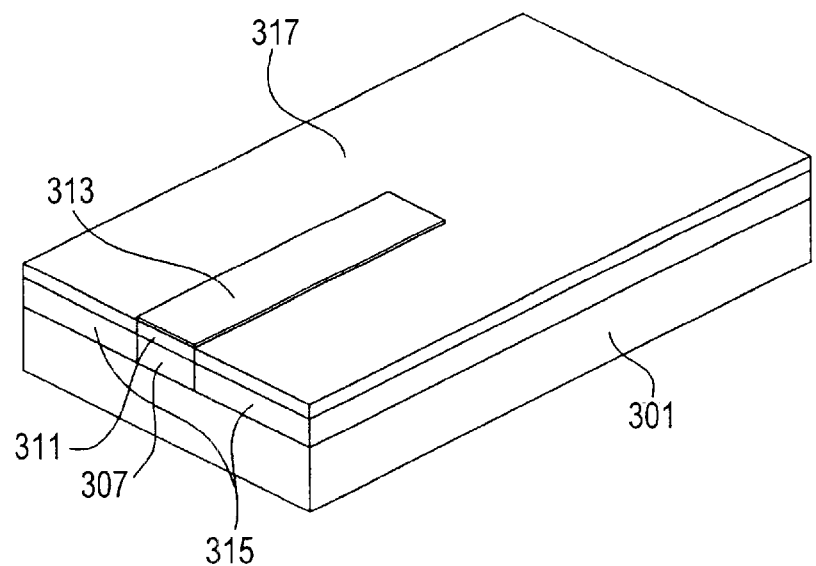
FIG. 18 is a perspective view showing a manufacture process (fifth step) of the semiconductor laser with modulator according to the third embodiment of the present invention.

The material InP is grown with respect to the active layer 307 so that a cladding layer 311 is formed (see FIG. 16).

A mask 313 is formed on the surface of the cladding layer 311 in order to etch like an island. Then, the cladding layer 311 and the active layer 307 formed in the laser forming region LR, which are not coated with the mask 313, and both layers formed in the modulator forming region MR are removed by etching in succession, and thus, the surface of the substrate 301 is exposed. In this case, of the grating 303 formed on the substrate 301, the range (i.e., grating 303), which is not coated with the mask 313, is removed by etching (see FIG. 17).

In the above range, which is not coated with the mask 313, the material InGaAsP is grown using a metal organic vapor phase epiytaxy (MOVPE) method so that an absorptive layer 315 is formed. Further, the material InP is grown on the absorptive layer 315 so that a cladding layer 317 is formed (see FIG. 18).

After the mask 313 is removed, a selective growth mask pair 318 is formed on the cladding layer 317 of the laser forming region LR. Each mask width of the masks constituting the selective growth mask pair 318 is set to a range from 5 to 100 μm, and an interval between masks is set to a range from 1 to 40 μm.

Figure 19:
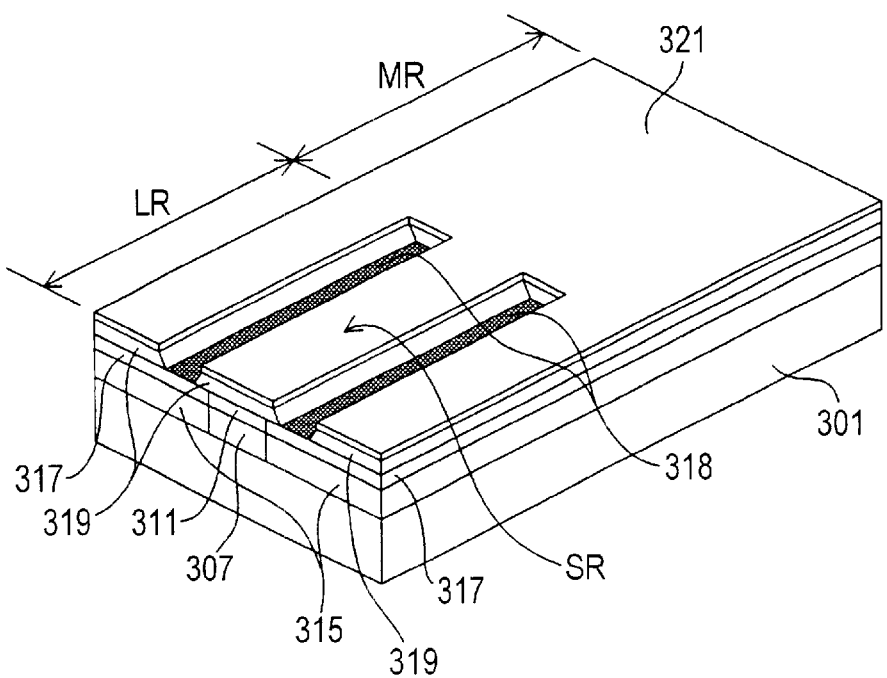
FIG. 19 is a perspective view showing a manufacture process (sixth step) of the semiconductor laser with modulator according to the third embodiment of the present invention.
Figure 20:
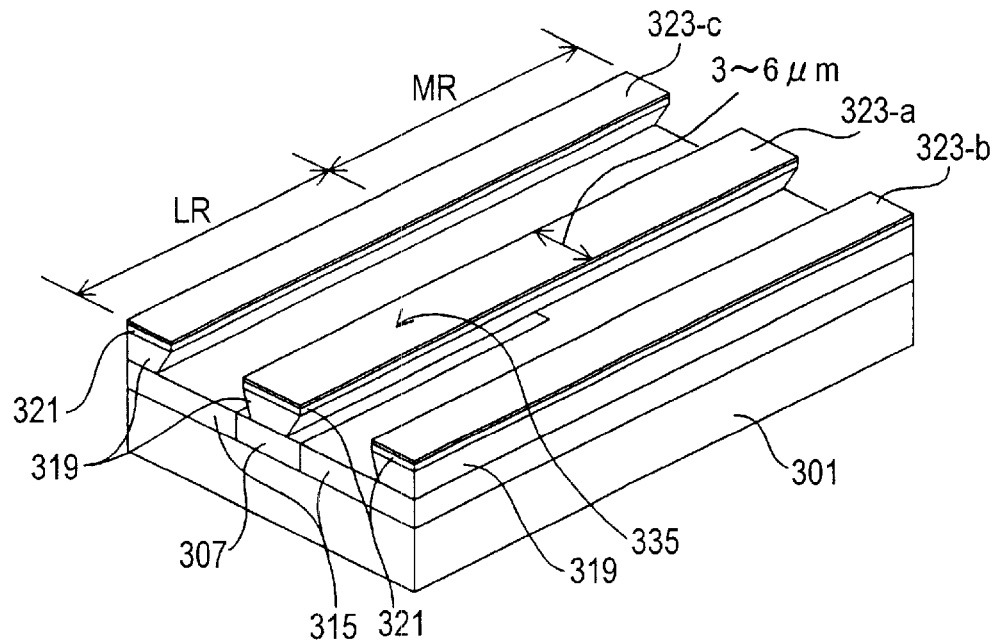
FIG. 20 is a perspective view showing a manufacture process (seventh step) of the semiconductor laser with modulator according to the third embodiment of the present invention.
Figure 21:
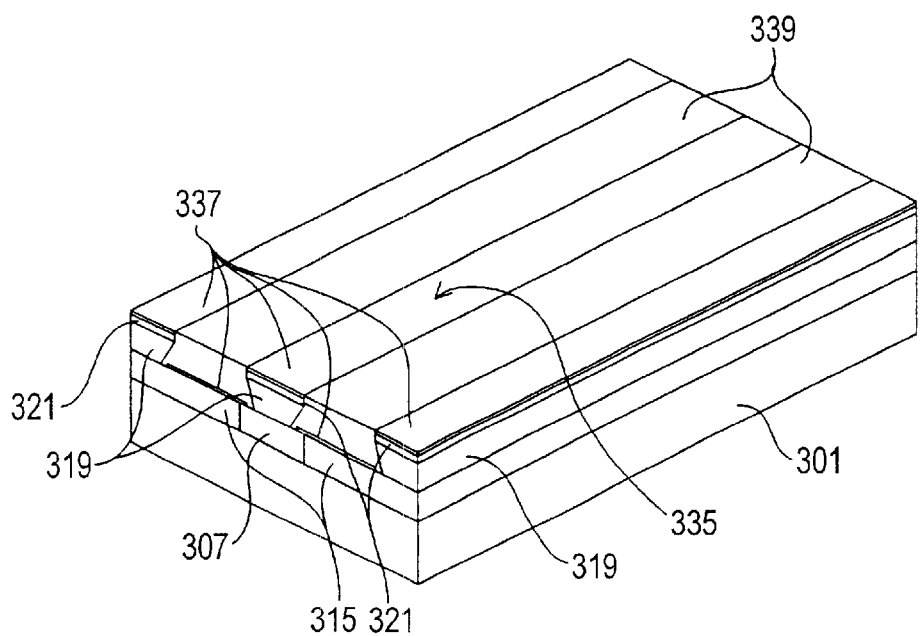
FIG. 21 is a perspective view showing a manufacture process (eighth step) of the semiconductor laser with modulator according to the third embodiment of the present invention.
Figure 22:
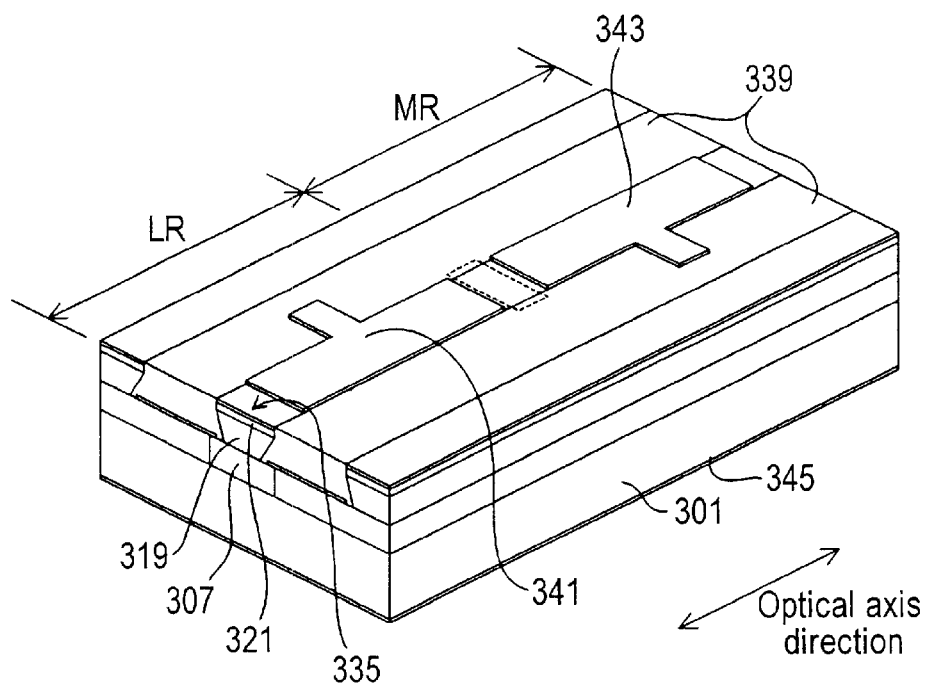
FIG. 22 is a perspective view showing a manufacture process (ninth step) of the semiconductor laser with modulator according to the third embodiment of the present invention.
Figure 23:
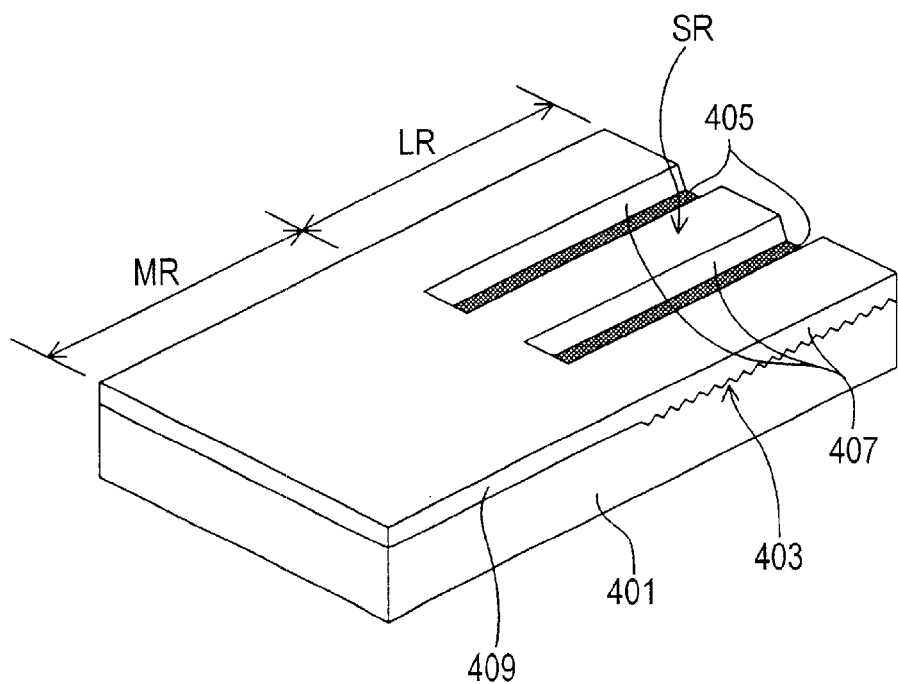
FIG. 23 is a perspective view showing a manufacture process (first step) of a semiconductor laser with modulator according to a fourth embodiment of the present invention.
Figure 24:
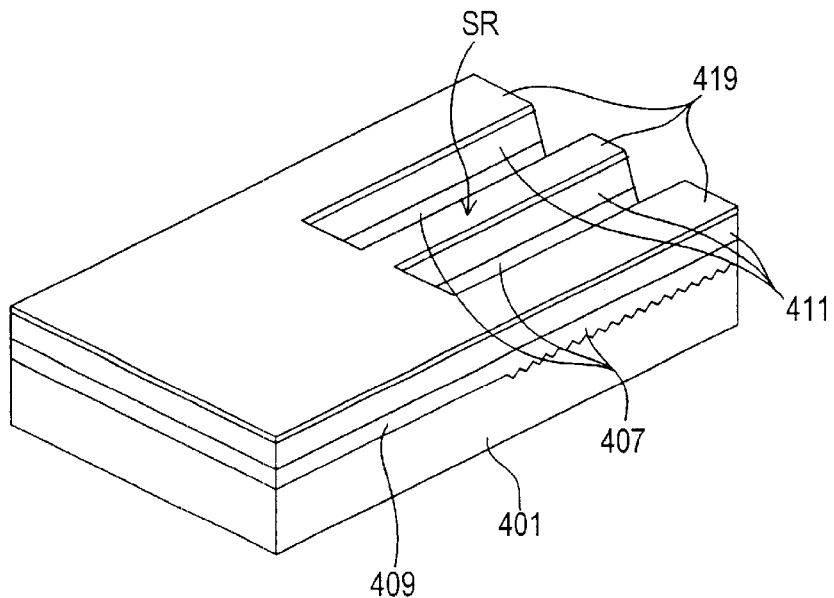
FIG. 24 is a perspective view showing a manufacture process (second step) of the semiconductor laser with modulator according to the fourth embodiment of the present invention.
Figure 25:
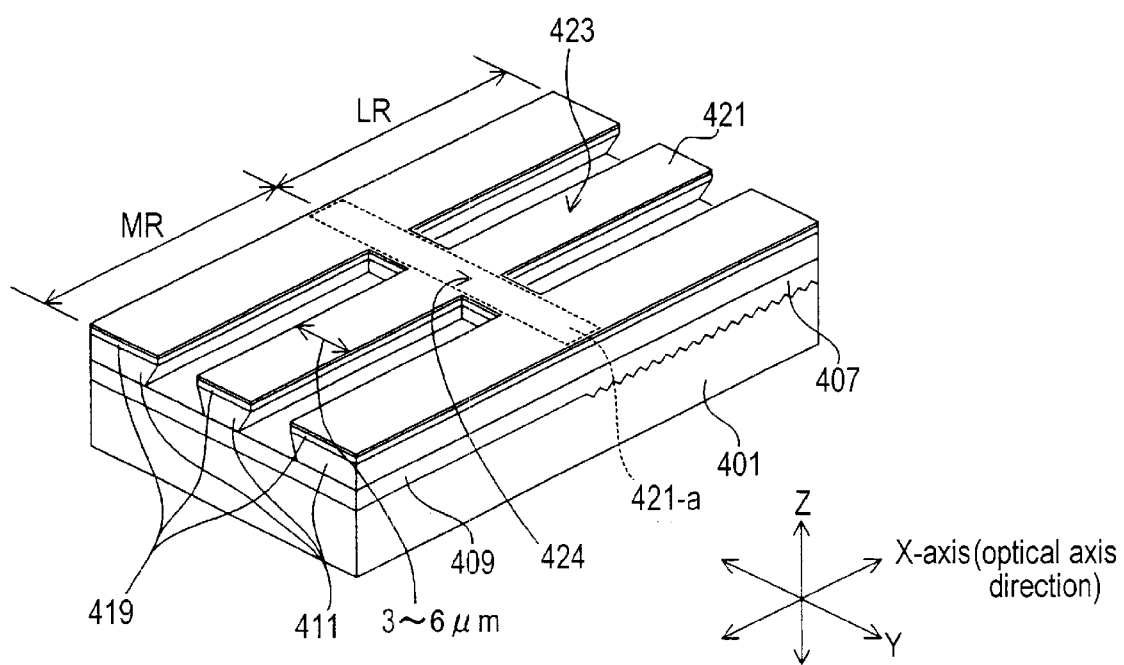
FIG. 25 is a perspective view showing a manufacture process (third step) of the semiconductor laser with modulator according to the fourth embodiment of the present invention.
Figure 26:
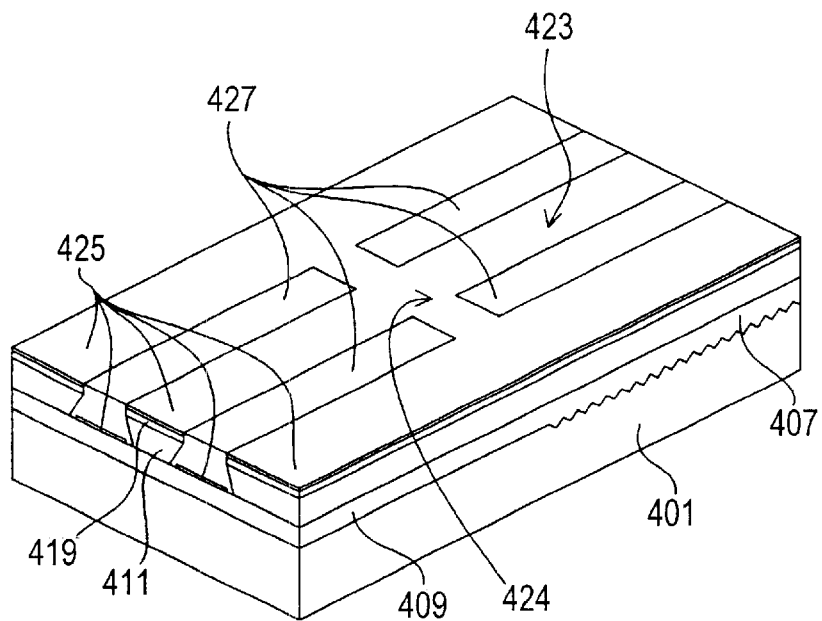
FIG. 26 is a perspective view showing a manufacture process (fourth step) of the semiconductor laser with modulator according to the fourth embodiment of the present invention.
Figure 27:
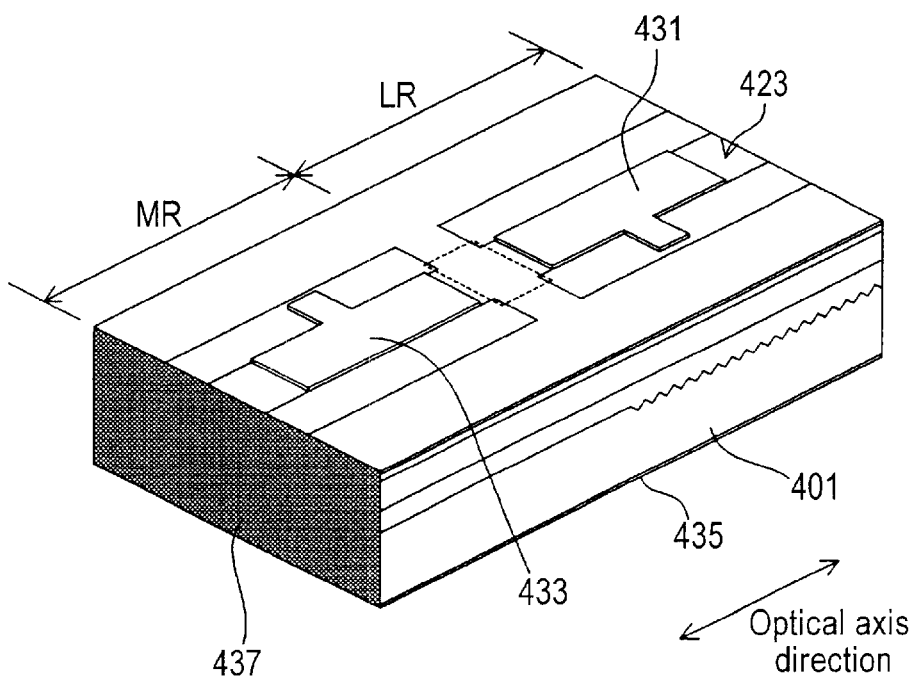
FIG. 27 is a perspective view showing a manufacture process (fifth step) of the semiconductor laser with modulator according to the fourth embodiment of the present invention.
Figure 28:
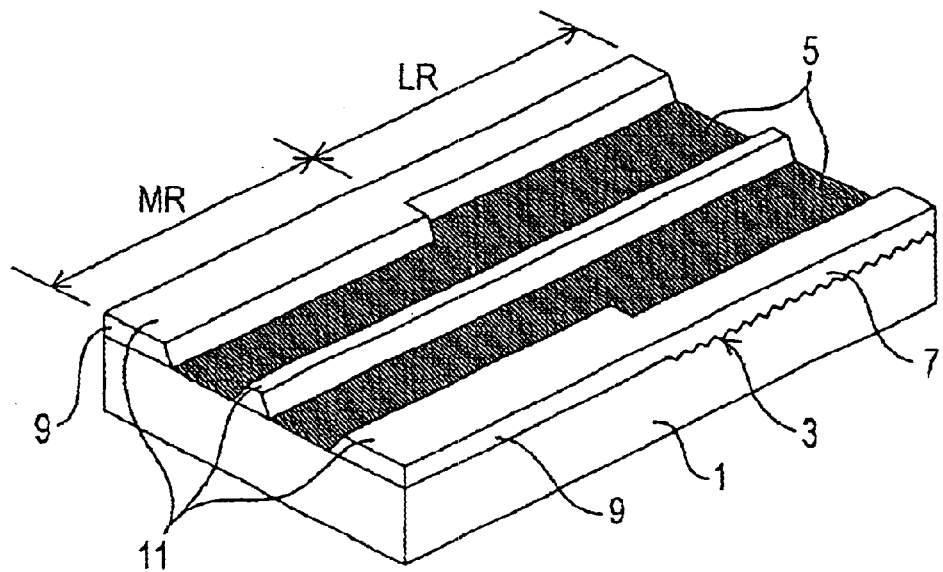
FIG. 28 is a perspective view showing a manufacture process (first step) of a conventional semiconductor laser with modulator.
Figure 29:
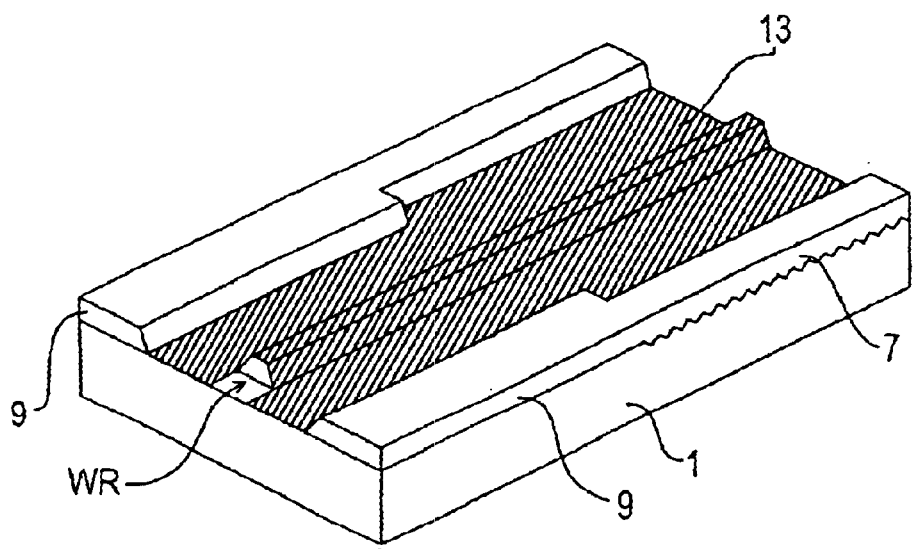
FIG. 29 is a perspective view showing a manufacture process (second step) of the conventional semiconductor laser with modulator.
Figure 30:
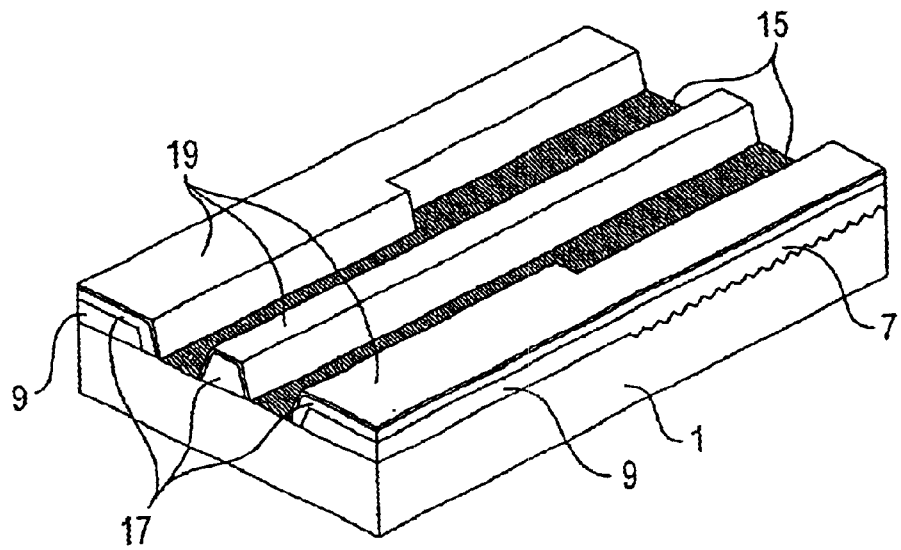
FIG. 30 is a perspective view showing a manufacture process (third step) of the conventional semiconductor laser with modulator.
Figure 31:
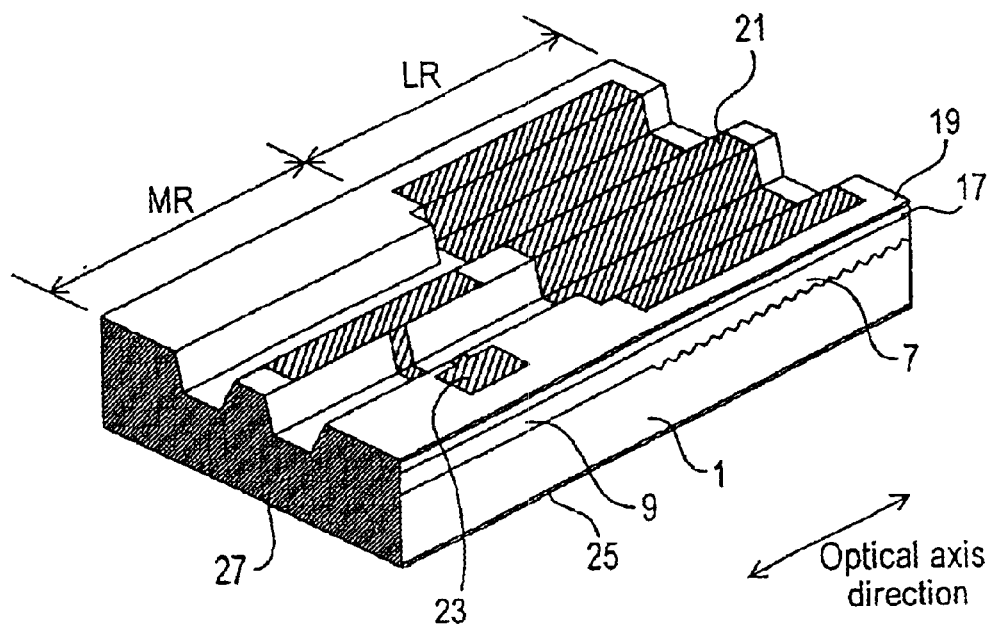
FIG. 31 is a perspective view showing a manufacture process (fourth step) of the conventional semiconductor laser with modulator.

The material p-InP is selectively grown on the cladding layers 311 and 317 using the selective growth mask pair 318 so that a cladding layer 319 including the cladding layers 311 and 317 is formed. Further, the material p-InGaAs is selectively grown on the cladding layer 319 so that a contact layer 321 is formed (FIG. 19). In this case, in a region held between masks constituting the selective growth mask pair 318, that is, in a selective growth region SR, the materials p-InP and p-InGaAsP grow thicker than other regions. Therefore, in the selective growth region SR, the cladding layer 319 and the contact layer 321 are thicker than these cladding layer 319 and contact layer 321 formed in other regions (modulator forming region MR, in particular).

After the selective growth mask pair 318 is removed, a ridge part forming mask 323-a and side masks 323-b and 323-c are formed on the surface of the contact layer 321. The ridge part forming mask 323-a is formed over a range from the selective growth region SR of the laser forming region LR to the modulator forming region MR, and has a width of 3 to 6 μm.

The contact layer 321 and the cladding layer 319, which are not coated with the ridge part forming mask 323-a and the side masks 323-b and 323-c, are removed by etching in succession, and thus, part of the surface of active layer 307 and absorptive layer 315 is exposed. As a result, an inverse mesa-shaped ridge part 335 is formed (see FIG. 20).

The following is a description on a shape of the ridge part 335. As described above, the cladding layer 319 and the contact layer 321 are formed thicker in the selective growth region SR of the laser forming region LR than in the modulator forming region MR. Therefore, the ridge part 335 formed in the laser forming region LR is higher than that formed in the modulator forming region MR.

Now, it has attracted attention to a width $W_C$ of the bottom surface of the cladding layer 319 in the ridge part 335. The ridge part forming mask 323-a used for forming the ridge part 335 has a certain (fixed) mask width $W_M$ over the entire length from the laser forming region LR to the modulator forming region MR. In an etching process for forming the ridge part 335, when a face (111) of the cladding layer 319 is exposed, the face (i.e., side wall of the cladding layer 319) has an angle of 54° with respect to the surface of the active layer 307 and the absorptive layer 315. Therefore, when a thickness of the cladding layer 319 is set as "d", the width $W_C$ of the bottom surface of the cladding layer 319 in the ridge part 335 is obtained from the following equation (3-1).

$$W_C = W_M - 2d/\tan 54° \quad (3\text{-}1)$$

As is evident from the above equation (3-1), in the ridge part 335, the width $W_C$ of the bottom surface of the cladding layer 319 takes different value in accordance with a height "d" of the cladding layer 319. As described before, the height "d" of the cladding layer 319 differs in the laser forming region LR and the modulator forming region MR. When each height of the cladding layer 319 in these regions LR and MR is expressed as $d_L$ and $d_M$, the following equation (3-2) is formed.

$$d_L > d_M \quad (3\text{-}2)$$

Moreover, in the ridge part 335, when a width of the laser forming region LR at the bottom surface of the cladding layer 319 is expressed as $W_{CL}$, and a width of the modulator forming region MR is expressed as $W_{CM}$, the following relation (3-3) is obtained from the above equations (3-1) and (3-2).

$$W_{CL} < W_{CM} \quad (3\text{-}3)$$

By the way, in the ridge part 335, the bottom surface of the cladding layer 319 contacts with the active layer 307 and the absorptive layer 315. Therefore, in the ridge part 335, the width of the contact surface of the cladding layer 319 with the absorptive layer 315 is wider than a width of the contact surface of the cladding layer 319 with the active layer 307.

Next, the ridge part forming mask 323-a and the side masks 323-b and 223-c are removed, and thereafter, an insulation (dielectric) layer (SiO$_2$) 337 is formed. Then, the material, polyimide 339 is buried in each groove formed at both sides of the ridge part 335 (see FIG. 21).

A metal material is vapor-deposited on the upper surface of the ridge part 335 so that a predetermined pattern is formed. Moreover, a metal material is vapor-deposited onto the back side of the substrate 301. After the vapor deposition, an annealing treatment is subjected to the device so that the vapor-deposited metal is alloyed. By doing so, a laser p-side electrode 341 is formed in the laser forming region LR, and a modulator p-side electrode 343 is formed in the modulator forming region MR, and further, an n-side electrode 345 is formed onto the back side of the substrate 301. In this case, the contact layer 321 between the laser p-side electrode 341 and the modulator p-side electrode 343 is removed before the metal material is vapor-deposited so that an electrode isolating region (portion shown by a dotted line in FIG. 22, optical axis length: 20 to 100 μm) is secured.

The end portion of semiconductor device is cloven and made into a chip, and thereafter, an end face of the modulator forming region MR is coated with a low reflection film (not shown). In a chipped semiconductor laser with modulator, an optical axis length of the laser forming region LR is set to a range from 300 to 700 µm, and an optical axis length of the modulator forming region MR is set to a range from 50 to 250 µm (see FIG. 22).

The following is a description on an operation of the aforesaid semiconductor laser with modulator according to the third embodiment.

A forward voltage is applied to the laser p-side electrode 341 and the n-side electrode 345 so that a forward current is injected into the active layer 307. By the forward current, a laser oscillation occurs. In general, in the case where the forward current ranges from 50 to 100 mA, a laser power of 2 to 5 mW can be obtained.

On the other hand, a reverse voltage (0.5 to −4V) is applied to the modulator p-side electrode 343 and the n-side electrode 345, and thereby, a modulation signal (signal beam) is generated from laser beam. More specifically, in the case where a modulation voltage (reverse voltage) ranges from 0.5 to −0.5V, an optical power is obtained from the semiconductor laser with modulator; on the contrary, in the case where the modulation voltage ranges from −2.5 to −4V, the optical power is shielded. In the manner as described above, an intensity modulation of optical power is made, and thus, a signal beam is generated.

As described above, according to the manufacturing method of the semiconductor laser with modulator of this third embodiment, in the ridge part 335, the width of the contact surface of the cladding layer 319 with the absorptive layer 315 is wider than that of the contact surface of the cladding layer 319 with the active layer 307. Therefore, an absorption efficiency of laser beam is improved in the modulator forming region MR, and further, a radiant efficiency are improved. As a result, it is possible to improve a power (output) of laser beam in the laser forming region LR while preventing an element breakdown.

Moreover, according to the manufacturing method of the semiconductor laser with modulator of this third embodiment, the laser forming region LR and the modulator forming region MR are formed independently from each other, and thereafter, are directly coupled with each other. Therefore, a degree of freedom is improved in a device design.

Fourth Embodiment

A structure of semiconductor laser with modulator used as a semiconductor device according to a fourth embodiment of the present invention and a manufacturing method thereof will be described below with reference to FIG. 23 to FIG. 27.

A grating 403 is formed in a laser forming region LR of a substrate (InP) 401, and thereafter, a selective growth mask pair 405 is formed with respect to a laser forming region LR of the substrate 401. A mask width of each mask constituting the selective growth mask pair 405 is set to a range from 5 to 100 µm, and an interval between the mask pair is set to a range from 1 to 40 µm.

A material InGasP is selectively grown using a metal organic vapor phase epiytaxy (MOVPE) method. As a result, an active layer (multiple quantum wells (MQW) structure) 407 is formed in the laser forming region LR; on the other hand, an absorptive layer 409 is formed in a modulator forming region MR. In this case, in a region held between each mask constituting the selective growth mask pair 405, that is, a selective growth region SR, the material InGaAsP grows thicker than other regions (see FIG. 23). Then, a band gap of the active layer 407 formed in the selective growth region SR is wider than a band gap of the absorptive layer 409. Moreover, a wavelength of laser beam generated in the active layer 407 is shifted to a longer wavelength side as compared with the case where no selective growth mask pair 405 is used.

The material InP is grown with respect to the active layer 407 and the absorptive layer 409 so that a cladding layer 411 is formed. Further, a contact layer 419 is formed on the surface of the cladding layer 411. In this case, like the active layer 407, in the selective growth region SR, the cladding layer 411 and the contact layer 419 are formed thicker than other regions (see FIG. 24).

After the selective growth mask pair 405 is removed, a ridge part forming mask 421 is formed on the surface of the contact layer 419. The ridge part forming mask 421 is formed over the range from the selective growth region SR of the laser forming region LR to the modulator forming region MR, and has a width of 3 to 6 µm. Further, the ridge part forming mask 421 includes a slab waveguide forming region 421-a, which extends to a direction orthogonal to an optical axis direction. The slab waveguide forming region 421-a is positioned between the laser forming region LR and the modulator forming region MR.

The contact layer 419 and the cladding layer 411, which are not coated with the ridge part forming mask 421 are removed by etching in succession so that part of each surface of the active layer 407 and the absorptive layer 409 is exposed. As a result, an inverse mesa-shaped ridge part 423 is formed. Further, a slab waveguide (coupling part) 424 orthogonal to the ridge part 423 is positioned between the laser forming region LR and the modulator forming region MR (see FIG. 25).

The slab waveguide 424 extends to a direction orthogonal to the optical axis direction of the ridge part 423, and has no layer for confining a light in a direction (Y-axis direction shown in FIG. 25) parallel with the plane of the substrate 401. Therefore, in the laser forming region LR, when a laser beam propagated through the ridge part 423 is incident upon the modulator forming region MR, a density distribution of laser beam is reduced in the slab waveguide 424.

The following is a description on a shape of the ridge part 423. As described above, the active layer 407, the cladding layer 411 and the contact layer 419 in the selective growth region SR of the laser forming region LR are formed thicker than the absorptive layer 409, the cladding layer 411 and the contact layer 419 in the modulator forming region MR. Therefore, the ridge part 423 formed in the laser forming region LR is higher than that formed in the modulator forming region MR.

Now, it has attracted attention to a width $W_C$ of the bottom surface of the cladding layer 411 in the ridge part 423. The ridge part forming mask 421 used for forming the ridge part 423 has a certain (fixed) mask width $W_M$ over the entire length from the laser forming region LR to the modulator forming region MR. In an etching process for forming the ridge part 423, when a face (111) of the cladding layer 411 is exposed, the face (i.e., side wall of the cladding layer 411) has an angle of 54° with respect to the surface of the active layer 407 and the absorptive layer 409. Therefore, when a thickness of the cladding layer 411 is set as "d", the width $W_C$ of the bottom surface of the cladding layer 411 in the ridge part 423 is obtained from the following equation (4-1).

$$W_C = W_M - 2d/\tan 54° \quad (4\text{-}1)$$

As is evident from the above equation (4-1), in the ridge part 423, the width $W_C$ of the bottom surface of the cladding layer 411 takes different value in accordance with a height "d" of the cladding layer 411. As described before, the height "d" of the cladding layer 411 differs in the laser forming region LR and the modulator forming region MR. When each height of these regions LR and MR is expressed as $d_L$ and $d_M$, the following equation (4-2) is formed.

$$d_L > d_M \quad (4\text{-}2)$$

Moreover, in the ridge part 423, when a width of the laser forming region LR at the bottom surface of the cladding layer 411 is expressed as $W_{CL}$, and a width of the modulator forming region MR is expressed as $W_{CM}$, the following relation (4-3) is obtained from the above equations (4-1) and (4-2).

$$W_{CL} < W_{CM} \quad (4\text{-}3)$$

By the way, in the ridge part 423, the bottom surface of the cladding layer 411 contacts with the active layer 407 and the absorptive layer 409. Therefore, it can be seen that a width of the contact surface of the cladding layer 411 with the absorptive layer 409 in the ridge part 423 is wider than a width of the contact surface of the cladding layer 411 with the active layer 407.

Next, the ridge part forming mask 421 is removed so that an insulation (dielectric) film ($SiO_2$) 425 is formed. Then, a material, polyimide 427 is buried in each groove formed at both sides of the ridge part 423 and the slab waveguide 424 (see FIG. 26).

A metal material is vapor-deposited on the upper surface of the ridge part 423 so that a predetermined pattern is formed. Moreover, a metal material is vapor-deposited onto the back side of the substrate 401. After the vapor deposition, an annealing treatment is subjected so that the vapor-deposited metal is alloyed. By doing so, a laser p-side electrode 431 is formed in the laser forming region LR, and a modulator p-side electrode 433 is formed in the modulator forming region MR, and Ad further, an n-side electrode 435 is formed onto the back side of the substrate 401. In this case, the contact layer 419 between the laser p-side electrode 431 and the modulator p-side electrode 433 is removed before the metal material is vapor-deposited so that an electrode isolating region (portion shown by a dotted line in FIG. 27, optical axis length: 20 to 100 μm) is secured.

The end portion of semiconductor device is cloven and made into a chip, and thereafter, an end face of the modulator forming region MR is coated with a low reflection film 437. In a chipped semiconductor laser with modulator, an optical axis length of the laser forming region LR is set to a range from 300 to 700 μm, and an optical axis length of the modulator forming region MR is set to a range from 50 to 250 μm (see FIG. 27).

The following is a description on an operation of the aforesaid semiconductor laser with modulator according to the fourth embodiment.

A forward voltage is applied to the laser p-side electrode 431 and the n-side electrode 435 so that a forward current is injected into the active layer 407. By the forward current thus injected, a laser oscillation is generated. In general, in the case where the forward current ranges 50 to 100 mA, a laser output (power) of 2 to 5 mW can be obtained.

On the other hand, a reverse voltage (0.5 to −4V) is applied to the modulator p-side electrode 433 and the n-side electrode 435, and thereby, a modulation signal (signal beam) is generated from laser beam. More specifically, in the case where a modulation voltage (reverse voltage) ranges from 0.5 to −0.5V, an optical power is obtained from the semiconductor laser with modulator; on the contrary, in the case where the modulation voltage ranges from −2.5 to −4V, the optical power is shielded. In the manner as described above, an intensity modulation of optical power is made, and thus, a signal beam is generated.

As described above, according to this fourth embodiment, the semiconductor laser with modulator is constructed in a manner that in the ridge part 423, the width of the contact surface of the cladding layer 411 with the absorptive layer 409 is wider than that of the contact surface of the cladding layer 411 with the active layer 407. Therefore, an absorption efficiency of laser beam is improved in the modulator forming region MR, and further, a radiant efficiency are improved. As a result, it is possible to improve a power of laser beam in the laser forming region LR while preventing element breakdown.

Moreover, according to the manufacturing method of the semiconductor laser with modulator of the fourth embodiment, a crystal growth by selective growth method is carried out only one time, and thereby, it is possible to control a thickness of the cladding layer 411. In other words, there is no need of adding a special manufacture process for preventing an element breakdown in the modulator forming region MR. Therefore, this contributes to improvement in the yield of product.

Further, according to this fourth embodiment, the semiconductor laser with modulator is constructed in a manner that the slab waveguide 424 is provided at the coupling part between the laser forming region LR and the modulator forming region MR. Thus, in the laser forming region LR, when a laser beam propagated through the ridge part 423 is incident upon the modulator forming region MR, in the slab waveguide 424, the density distribution of laser beam is reduced. Therefore, the modulator in the modulator forming region MR can absorb a higher output laser beam emitted from a laser in the laser forming region LR without generating an element breakdown.

Preferred embodiments of the present invention have been described with reference to the accompanying drawings. The present invention is not limited to the above embodiments. It will be apparent for the skilled persons in the art to image various modifications and corrections in a range of technical concept set forth in the scope of this invention, and naturally, it can be recognized that these modifications and corrections belong to the technical range of the present invention.

For example, the embodiments of the present invention have described the semiconductor laser with modulator, which is composed of substrate and layer made of InP-based material. The present invention may be applicable to a semiconductor laser composed of other materials.

Moreover, the present invention is not limited to the semiconductor laser in its applicable range. Thus, the present invention may be applicable to a semiconductor device integrating multifunction elements, that is, a semiconductor device requiring a control of mesa width.

As is evident from the above description, according to the present invention, there is provided a semiconductor device, which includes a first region having an optical waveguide and a second region having a light receiving layer receiving a light from the first region. Therefore, in the semiconductor device, it is possible to improve a tolerance (resistance) with respect to a light from the light receiving layer of the second region. Further, it is possible to effectively manufacture the semiconductor device having the features as described above without adding a complicate process.

What is claimed is:

1. A semiconductor device comprising:
   a semiconductor substrate;
   an active layer formed on a first region of the semiconductor substrate;
   an absorptive layer formed on a second region of the semiconductor substrate adjacent to the first region of the semiconductor substrate;
   a cladding layer extending from an upper surface of the active layer to an upper surface of the absorptive layer;
   a first electrode formed on the cladding layer in the first region; and
   a second electrode formed on the cladding layer in the second region,
   wherein a width of a contact surface between the active layer and the cladding layer in the first region is narrower than a width of a contact surface between the absorptive layer and the cladding layer in the second region.

2. The semiconductor device according to claim 1, wherein the first region is a laser region and the second region is a modulator region.

3. The semiconductor device according to claim 2, wherein a grating is formed in the first region of the semiconductor substrate.

4. The semiconductor device according to claim 1, wherein a thickness of the cladding layer in the first region is greater than a thickness of the cladding layer in the second region.

5. The semiconductor device according to claim 1, wherein a width of the cladding layer at a surface on which the first electrode is formed thereon is greater than a width of the cladding layer at a surface contacting the active layer, and wherein a width of the cladding layer at a surface on which the second electrode is formed thereon is greater than a width of the cladding layer contacting the absorptive layer.

6. The semiconductor device according to claim 5, wherein a thickness of the cladding layer in the first region is greater than a thickness of the cladding layer in the second region.

7. The semiconductor device according to claim 1, wherein the cladding layer includes a wide part having a width greater than a width of the cladding layer under the first electrode and greater than a width of the cladding layer under the second electrode, and wherein the wide part of the cladding layer is between the cladding layer under the first electrode and the cladding layer under the second electrode.

8. The semiconductor device according to claim 1, wherein the active layer and the absorptive layer are composed of a common InGaAsP layer.

9. The semiconductor device according to claim 1, further comprising a layer for confining light formed at a side of the cladding layer.

10. The semiconductor device according to claim 9, wherein the layer for confining light is polyimide.

11. A semiconductor device comprising:
    a semiconductor substrate;
    an active layer formed on a first region of the semiconductor substrate;
    an absorptive layer formed on a second region of the semiconductor substrate different from the first region of the semiconductor substrate;
    a cladding layer extending from an upper surface of the active layer to an upper surface of the absorptive layer;
    a first electrode formed on the cladding layer in the first region; and
    a second electrode formed on the cladding layer in the second region,
    wherein the cladding layer has a wide part between the cladding layer under the first electrode and the cladding layer under the second electrode, and wherein the wide part of the cladding layer has a width greater than a width of the cladding layer under the first electrode and greater than a width of the cladding layer under the second electrode.

12. The semiconductor device according to claim 11, further comprising a layer for confining light formed at a side of the cladding layer.

13. The semiconductor device according to claim 12, wherein the layer for confining light is polyimide.

14. The semiconductor device according to claim 11, wherein a grating is formed in the first region of the semiconductor substrate.

15. The semiconductor device according to claim 11, wherein a thickness of the cladding layer in the first region is greater than a thickness of the cladding layer in the second region.

16. The semiconductor device according to claim 11, wherein a width of the cladding layer at a surface on which the first electrode is formed thereon is greater than a width of the cladding layer at a surface contacting the active layer, and wherein a width of the cladding layer at a surface on which the second electrode is formed thereon is greater than a width of the cladding layer contacting the absorptive layer.

17. A semiconductor device comprising:
    a laser including an active layer formed on a semiconductor substrate, a first cladding layer formed on the active layer and a first electrode formed on the first cladding layer;
    a modulator including an absorptive layer formed on the semiconductor substrate, a second cladding layer formed on the absorptive layer and a second electrode formed on the second cladding layer, the modulator extending along an optical axis of the laser; and
    a coupler located between the first cladding layer and the second cladding layer that provides a laser beam output from the laser to the modulator, and that reduces a density distribution of the laser beam.

18. The semiconductor device according to claim 17, wherein the first cladding layer and the second cladding layer are formed from a common cladding layer.

19. The semiconductor device according to claim 18, wherein the coupler is a portion of the common cladding layer having a width greater than a width of the first and second cladding layers.

20. The semiconductor device according to claim 17, wherein a width of an upper surface of the first cladding layer is greater than a width of the first cladding layer at a surface of the active layer, and a width of an upper surface of the second cladding layer is greater than a width of the second cladding layer at a surface of the absorptive layer.

21. The semiconductor device according to claim 20, wherein a thickness of the first cladding layer is greater than a thickness of the second cladding layer.

* * * * *